US006254672B1

(12) United States Patent
Falster et al.

(10) Patent No.: US 6,254,672 B1

(45) **Date of Patent: *Jul. 3, 2001**

(54) LOW DEFECT DENSITY SELF-INTERSTITIAL DOMINATED SILICON

(75) Inventors: Robert A. Falster, Milan (IT); Joseph C. Holzer; Steve A. Markgraf, both of St. Charles, MO (US); Paolo Mutti, Merano (IT); Seamus A. McQuaid, St. Louis, MO (US); Bayard K. Johnson, Lake St. Louis, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/057,801

(22) Filed: Apr. 9, 1998

Related U.S. Application Data

(60) Provisional application No. 60/041,845, filed on Apr. 9, 1997.

(51) Int. Cl.[7] ..... C30B 15/14; C30B 29/06

(52) U.S. Cl. ..... 117/13; 117/20; 117/35; 117/532

(58) Field of Search ..... 117/932, 13, 20, 117/35

(56) References Cited

U.S. PATENT DOCUMENTS

| | | | |
|---|---|---|---|
| 4,314,595 | 2/1982 | Yamamoto et al. | 148/1.5 |
| 4,981,549 | 1/1991 | Yamashita et al. | 156/620.4 |
| 5,264,189 | 11/1993 | Yamashita et al. | 422/249 |
| 5,474,020 | 12/1995 | Bell et al. | 117/20 |
| 5,485,803 | 1/1996 | Habu | 117/14 |
| 5,487,354 | 1/1996 | von Ammon et al. | 117/13 |
| 5,667,584 | 9/1997 | Takano et al. | 117/13 |
| 5,704,973 | 1/1998 | Sakurada et al. | 117/15 |
| 5,728,211 | 3/1998 | Takano et al. | 117/14 |
| 5,954,873 | 9/1999 | Hourai et al. | 117/13 |
| 5,968,262 | 10/1999 | Saishouji et al. | 117/13 |
| 5,968,264 | 10/1999 | Iida et al. | 117/30 |
| 6,045,610 | 4/2000 | Park et al. | 117/13 |
| 6,153,008 | 10/2000 | Von Ammon et al. . | |

FOREIGN PATENT DOCUMENTS

| | | |
|---|---|---|
| 39 05 626 A1 | 8/1989 | (DE) . |
| 43 23 964 A1 | 1/1994 | (DE) . |

(List continued on next page.)

OTHER PUBLICATIONS

Voronkov, "The Mechanism of Swirl Defects Formation in Silicon", Journal of crystal growth vol. 59 pp. 625–643, 1982.*

(List continued on next page.)

*Primary Examiner*—Robert Kunemund

(74) *Attorney, Agent, or Firm*—Senniger, Powers, Leavitt & Roedel

(57) ABSTRACT

The present invention relates to single crystal silicon, in ingot or wafer form, which contains an axially symmetric region which is free of agglomerated intrinsic point defects, and a process for the preparation thereof. The process for growing the single crystal silicon ingot comprises controlling (i) a growth velocity, v, (ii) an average axial temperature gradient, $G_0$, during the growth of a constant diameter portion of the crystal over a temperature range from solidification to a temperature of no less than about 1325° C., and (iii) a cooling rate of the crystal from a solidification temperature to about 1,050° C., in order to cause the formation of an axially symmetrical segment which is substantially free of agglomerated intrinsic point defects. This axially symmetric region extends inwardly from the circumferential edge of the ingot, has a width as measured from the circumferential edge radially toward the central axis of the ingot which is at least about three-tenths the length of the radius of the ingot, and has a length as measured along the central axis of at least about two-tenths the length of the constant diameter portion of the ingot.

20 Claims, 28 Drawing Sheets

FOREIGN PATENT DOCUMENTS

| | | | |
|---|---|---|---|
| 44 14 947 A1 | 4/1994 | (DE) . | |
| 198 06 045 A1 | 2/1998 | (DE) . | |
| 0 504 837 A2 | 3/1992 | (EP) . | |
| 0 503 816 B1 | 9/1992 | (EP) | C30B/33/02 |
| 0 536 958 A1 | 10/1992 | (EP) . | |
| 0 716 168 A1 | 11/1995 | (EP) . | |
| 0 799 913 A1 | 10/1997 | (EP) | C30B/15/00 |
| 0 962 556 A1 | 8/1999 | (EP) | C30B/15/00 |
| 2182 262 | 10/1986 | (GB) . | |
| 2-180789 | 7/1990 | (JP) | C30B/15/20 |
| 4-108682 | 4/1992 | (JP) | C30B/15/00 |
| HO 8-268794 | 3/1995 | (JP) . | |
| 7-158458 | 5/1995 | (JP) . | |
| HO 9-202690 | 1/1996 | (JP) . | |
| 11-157995 | 6/1999 | (JP) | C30B/29/06 |
| 11-180800 | 7/1999 | (JP) | C30B/29/06 |
| 11-189495 | 7/1999 | (JP) | C30B/29/06 |
| 11-199386 | 7/1999 | (JP) | C30B/29/06 |
| 11-199387 | 7/1999 | (JP) | C30B/29/06 |
| WO 97/26393 | 1/1996 | (WO) . | |
| WO 98/45507 | 10/1998 | (WO) | C30B/15/00 |
| WO 98/45508 | 10/1998 | (WO) | C30B/15/00 |
| WO 98/45509 | 10/1998 | (WO) | C30B/15/00 |
| WO 98/45510 | 10/1998 | (WO) | C30B/15/00 |

OTHER PUBLICATIONS

Eidenzon, A.M., et al., "Defect–Free Silicon Crystals Grown by the Czochralski Technique", Inorganic Materials, 1997, pp. 219–225, vol. 33, No. 3, Interperiodica Publishing.

Eidenzon, A.M., et al., "Influence of Growth Rate on Swirl Defects in Large Dislocation–Free Crystals of Silicon Grown by the Czochralski Method", Sov. Phys. Crystallogr., 1985, pp. 576–580, vol. 30, No. 5, American Institute of Physics.

Puzanov, N.I., et al., "Relaxation in a System of Point Defects in a Growing Dislocation–Free Crystal of Silicon", Sov. Phys. Crystallogr., 1986, pp. 219–222, vol. 31, No. 2, American Institute of Physics.

Puzanov, N.I. et al.; "The Effect Of Thermal History During Crystal Growth On Oxygen Precipitation In Czochralski-grown Silicon"; *Semicond. Sci. Technol.*; vol. 7; pp. 406–413; 1992.

Puzanov, N.I. et al.; "Modelling Microdefect Distribution In Dislocation–Free Si Crystals Grown From The Melt"; *Journal of Crystal Growth 178*; pp. 468–478; 1997.

Puzanov, N.I. et al.; "Formation Of The Bands Of Anomalous Oxygen Precipitation In Czochralski–grown Si Crystals"; *Journal of Crystal Growth 137*; pp. 642–652; 1994.

Puzanov, N.I. et al.; "The Role Of Intrinsic Point Defects In The Formation Of Oxygen Precipitation Centers In Dislocation–Free Silicon"; *Crystallography Reports*; vol. 41; No. 1; pp. 134–141; 1996.

Puzanov, N.I. et al.; "Harmful Microdefects In The SeedEnd Portion Of Large–Diameter Silicon Ingots"; *Inorganic Materials*; vol. 33; No. 8; pp. 765–769; 1997.

R. Winkler et al. "Improvement of the Gate Oxide Integrity by Modifying Crystal Pulling and Its Impact on Device Failures" Journal of the Electrochemical Society, vol. 141, No. 5 (May 1994) pp. 1398–1401.

H. Zimmerman et al. "Vacancy Concentration Wafer mapping in Silicon" Journal of Crystal Growth, vol. 129, (1993), pp. 582–592.

Dornberger, E., et al., "Simulation of Grown–In Voids in Czochralski Silicon Crystals", Electrochemical Society Proceedings, vol. 97, No. 22, pp. 40–49.

Dornberger, E., et al., "Simulation of Non–Uniform Grown–In Void Distributions in Czochralski Silicon Crystals", Electrochemical Society Proceedings, vol. 98, vol. 1, pp. 490–503.

G. Kissinger, et al. "A Method for Studying the Grown–In Defect Density Spectra in Czochralski Silicon Wafers" Journal of Electrochemical Society, vol. 144, No. 4 (1997), pp. 1447–1456.

A.J.R. de Kock, et al. "The Effect of Doping on the Formation of Swirl Defects in Dislocation–Free Czochralski-Grown Silicon Crystals" Journal of Crystal Growth, vol. 49 (1980), pp. 718–734.

von Ammon et al. "The Dependence of Bulk Defects on the Axial Temperature Gradient of Silicon Crystals During Czochralski Growth" Journal of Crystal Growth, vol. 151 (1995) pp. 273–277.

E. Dornberger et al., "The Dependence of Ring Like Distributed Stacking Faults on the Axial Temperature Gradient of Growing Czochralski Dilicon Crystals" Electrochemical Society Proceedings, vol. 95–4, (May 1995) pp. 294–305.

V. Voronkov et al., "Behaviour and Effects of Intrinsic Point Defects in the Growth of Large Silicon Crystals" Electrochemical Society Proceedings, vol. 97–22, (Aug. 1997), pp. 3–17.

Dornberger, E., et al., "The Impact of Dwell Time Above 900°C During Crystal Growth on the Gate Oxide Integrity of Silicon Wafers", Electrochemical Society Proceedings, vol. 96, No. 13, pp. 140–151.

Nakamura, Kozo, et al., "Formation Process of Grown–In Defects in Czochralski Grown Silicon Crystals", Journal of Crystal Growth, vol. 180, pp. 61–72, 1997.

Sinno, T., et al., "On the Dynamics of the Oxidation–Induced Stacking–Fault Ring in as–grown Czochralski silicon crystals", Applied Physics Letters, vol. 70, No. 17, pp. 2250–2252, 1997.

Sinno, T., et al., "Point Defect Dynamics and the Oxidation–Induced Stacking–Fault Ring in Czochralski–Grown Silicon Crystals", J. Electrochem. Soc., vol. 145, No. 1, pp. 302–318, 1998.

Tan, T. Y., "Point Defects, Diffusion Processes, and Swirl Defect Formation in Silicon", Appl. Phys. A., vol. 37, pp. 1–17, 1985.

Vanhellemont, J., et al., "Defects in As–Grown Silicon and Their Evolution During Heat Treatments", Materials Science Forum, vol. 258–263, pp. 341–346, 1997.

* cited by examiner

SEED CONE, 14
10
AXIALLY SYMMETRIC
REGION, 6
CONSTANT
DIAMETER
PORTION, 18
WIDTH AS MEASURED FROM
EDGE TOWARD AXIS, 22
RADIUS, 4
CIRCUMFERENTIAL
EDGE, 20
26
END CONE, 16
AXIS, 12

V/I BOUNDARY, 2
SHOWING VARIABILITY
LENGTH OF
REGION, 24
WIDTH OF AXIALLY SYMMETRIC
REGION WITHIN GIVEN LENGTH, 22
AXIS, 12

TEMPERATURE PROFILES FOR VARIOUS HOT ZONE CONFIGURATIONS
TEMPERATURE (C)
1500
1400
1300
1200
1100
1000
900
800
700
600
500
400
300
200
0
200
400
600
800
1000
1200
1400
1600
1800
AXIAL POSITION (mm)

LOW DEFECT DENSITY SELF-INTERSTITIAL DOMINATED SILICON

REFERENCE TO RELATED APPLICATION

This application claims priority from U.S. provisional application, U.S. Ser. No. 60/041,845, filed on Apr. 9, 1997.

BACKGROUND OF THE INVENTION

The present invention generally relates to the preparation of semiconductor grade single crystal silicon which is used in the manufacture of electronic components. More particularly, the present invention relates to single crystal silicon ingots and wafers having an axially symmetric region which is devoid of agglomerated intrinsic point defects, and a process for the preparation thereof.

Single crystal silicon, which is the starting material for most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon and a single crystal is grown by slow extraction. After formation of a neck is complete, the diameter of the crystal is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter must be reduced gradually to form an end-cone. Typically, the end-cone is formed by increasing the crystal pull rate and heat supplied to the crucible. When the diameter becomes small enough, the crystal is then separated from the melt.

In recent years, it has been recognized that a number of defects in single crystal silicon form in the crystal growth chamber as the crystal cools after solidification. Such defects arise, in part, due to the presence of an excess (i.e. a concentration above the solubility limit) of intrinsic point defects, which are known as vacancies and self-interstitials. Silicon crystals grown from a melt are typically grown with an excess of one or the other type of intrinsic point defect, either crystal lattice vacancies ("V") or silicon self-interstitials ("I"). It has been suggested that the type and initial concentration of these point defects in the silicon are determined at the time of solidification and, if these concentrations reach a level of critical supersaturation in the system and the mobility of the point defects is sufficiently high, a reaction, or an agglomeration event, will likely occur. Agglomerated intrinsic point defects in silicon can severely impact the yield potential of the material in the production of complex and highly integrated circuits.

Vacancy-type defects are recognized to be the origin of such observable crystal defects as D-defects, Flow Pattern Defects (FPDs), Gate Oxide Integrity (GOI) Defects, Crystal Originated Particle (COP) Defects, crystal originated Light Point Defects (LPDs), as well as certain classes of bulk defects observed by infrared light scattering techniques such as Scanning Infrared Microscopy and Laser Scanning Tomography. Also present in regions of excess vacancies are defects which act as the nuclei for ring oxidation induced stacking faults (OISF). It is speculated that this particular defect is a high temperature nucleated oxygen agglomerate catalyzed by the presence of excess vacancies.

Defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

The density of such vacancy and self-interstitial agglomerated defects in Czochralski silicon is conventionally within the range of about $1*10^3/cm^3$ to about $1*10^7/cm^3$. While these values are relatively low, agglomerated intrinsic point defects are of rapidly increasing importance to device manufacturers and, in fact, are now seen as yield-limiting factors in device fabrication processes.

To date, there generally exists three main approaches to dealing with the problem of agglomerated intrinsic point defects. The first approach includes methods which focus on crystal pulling techniques in order to reduce the number density of agglomerated intrinsic point defects in the ingot. This approach can be further subdivided into those methods having crystal pulling conditions which result in the formation of vacancy dominated material, and those methods having crystal pulling conditions which result in the formation of self-interstitial dominated material. For example, it has been suggested that the number density of agglomerated defects can be reduced by (i) controlling $v/G_0$ to grow a crystal in which crystal lattice vacancies are the dominant intrinsic point defect, and (ii) influencing the nucleation rate of the agglomerated defects by altering (generally, by slowing down) the cooling rate of the silicon ingot from about 1100° C. to about 1050° C. during the crystal pulling process. While this approach reduces the number density of agglomerated defects, it does not prevent their formation. As the requirements imposed by device manufacturers become more and more stringent, the presence of these defects will continue to become more of a problem.

Others have suggested reducing the pull rate, during the growth of the body of the crystal, to a value less than about 0.4 mm/minute. This suggestion, however, is also not satisfactory because such a slow pull rate leads to reduced throughput for each crystal puller. More importantly, such pull rates lead to the formation of single crystal silicon having a high concentration of self-interstitials. This high concentration, in turn, leads to the formation of agglomerated self-interstitial defects and all the resulting problems associated with such defects.

A second approach to dealing with the problem of agglomerated intrinsic point defects includes methods which focus on the dissolution or annihilation of agglomerated intrinsic point defects subsequent to their formation. Generally, this is achieved by using high temperature heat treatments of the silicon in wafer form. For example, Fusegawa et al. propose, in European Patent Application 503,816 A1, growing the silicon ingot at a growth rate in excess of 0.8 mm/minute, and heat treating the wafers which are sliced from the ingot at a temperature in the range of 1150° C. to 1280° C. to reduce the defect density in a thin region near the wafer surface. The specific treatment needed will vary depending upon the concentration and location of agglomerated intrinsic point defects in the wafer. Different wafers cut from a crystal which does not have a uniform axial concentration of such defects may require different post-growth processing conditions. Furthermore, such wafer heat treatments are relatively costly, have the potential for introducing metallic impurities into the silicon wafers, and are not universally effective for all types of crystal-related defects.

A third approach to dealing with the problem of agglomerated intrinsic point defects is the epitaxial deposition of a thin crystalline layer of silicon on the surface of a single crystal silicon wafer. This process provides a single crystal silicon wafer having a surface which is substantially free of agglomerated intrinsic point defects. Epitaxial deposition, however, substantially increases the cost of the wafer.

In view of these developments, a need continues to exist for a method of single crystal silicon preparation which acts to prevent the formation of agglomerated intrinsic point defects by suppressing the agglomeration reactions which produce them. Rather than simply limiting the rate at which such defects form, or attempting to annihilate some of the defects after they have formed, a method which acts to suppress agglomeration reactions would yield a silicon substrate that is substantially free of agglomerated intrinsic point defects. Such a method would also afford single crystal silicon wafers having epi-like yield potential, in terms of the number of integrated circuits obtained per wafer, without having the high costs associated with an epitaxial process.

SUMMARY OF THE INVENTION

Among the objects of the present invention, therefore, is the provision of single crystal silicon in ingot or wafer form having an axially symmetric region of substantial radial width which is substantially free of defects resulting from an agglomeration of crystal lattice vacancies or silicon self-interstitials; and the provision of a process for preparing a single crystal silicon ingot in which the concentration of vacancies and self-interstitials is controlled in order to prevent an agglomeration of intrinsic point defects in an axially symmetric segment of a constant diameter portion of the ingot, as the ingot cools from the solidification temperature.

Briefly, therefore, the present invention is directed to a process for growing a single crystal silicon ingot in which the ingot comprises a central axis, a seed-cone, an end-cone and a constant diameter portion between the seed-cone and the end-cone having a circumferential edge and a radius extending from the central axis to the circumferential edge. In the process, the ingot is grown from a silicon melt and then cooled from the solidification temperature in accordance with the Czochralski method. In particular, the process comprises controlling (i) a growth velocity, v, (ii) an average axial temperature gradient, $G_0$, during the growth of the constant diameter portion of the crystal over the temperature range from solidification to a temperature of no less than about 1325° C., and (iii) the cooling rate of the crystal from the solidification temperature to about 1,050° C. to cause the formation of an axially symmetrical segment which is substantially free of agglomerated intrinsic point defects wherein the axially symmetric region extends inwardly from the circumferential edge of the ingot, has a width as measured from the circumferential edge radially toward the central axis of the ingot which is at least about three-tenths the length of the radius of the ingot, and has a length as measured along the central axis of at least about two-tenths the length of the constant diameter portion of the ingot.

Other objects and features of this invention will be in part apparent and in part pointed out hereinafter.

DETAILED DESCRIPTION OF THE PREFERRED EMBODIMENTS

Based upon experimental evidence to date, it appears that the type and initial concentration of intrinsic point defects is initially determined as the ingot cools from the temperature of solidification (i.e., about 1410° C.) to a temperature greater than 1300° C. (i.e., at least about 1325° C., at least about 1350° C. or even at least about 1375° C.). That is, the type and initial concentration of these defects are controlled by the ratio $v/G_0$, where v is the growth velocity and $G_0$ is the average axial temperature gradient over this temperature range.

Figure 1:
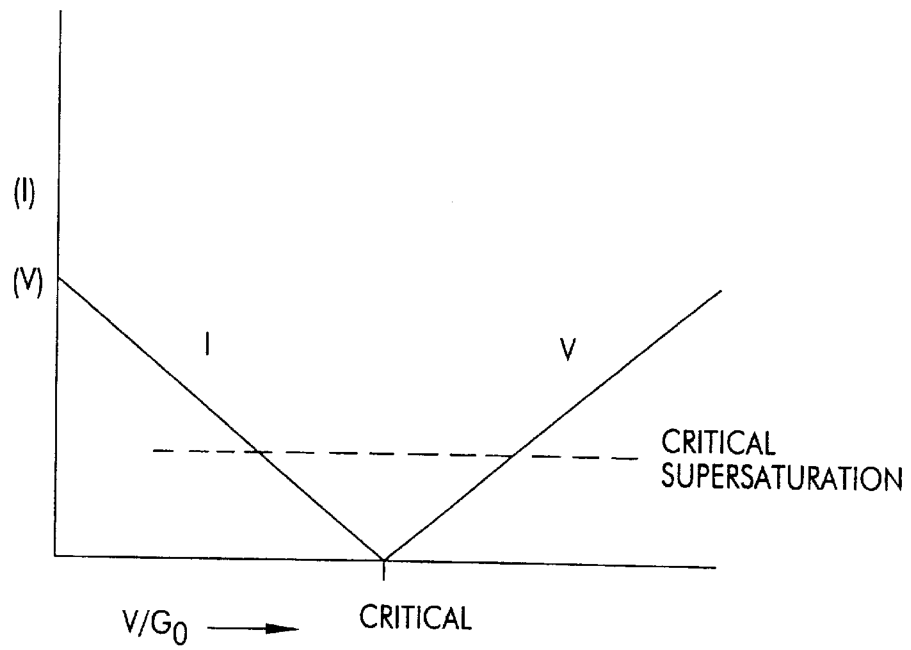
FIG. 1 is a graph which shows an example of how the initial concentration of self-interstitials, [I], and vacancies, [V], changes with an increase in the value of the ratio $v/G_0$, where v is the growth rate and $G_0$ is the average axial temperature gradient.

Referring to FIG. 1, for increasing values of $v/G_0$, a transition from decreasingly self-interstitial dominated growth to increasingly vacancy dominated growth occurs near a critical value of $v/G_0$ which, based upon currently available information, appears to be about $2.1\times10_{-5}$ $cm^2/sK$, where $G_0$ is determined under conditions in which the axial temperature gradient is constant within the temperature range defined above. At this critical value, the concentrations of these intrinsic point defects are at equilibrium.

As the value of $v/G_0$ exceeds the critical value, the concentration of vacancies increases. Likewise, as the value of $v/G_0$ falls below the critical value, the concentration of self-interstitials increases. If these concentrations reach a level of critical supersaturation in the system, and if the mobility of the point defects is sufficiently high, a reaction, or an agglomeration event, will likely occur. Agglomerated intrinsic point defects in silicon can severely impact the yield potential of the material in the production of complex and highly integrated circuits.

In accordance with the present invention, it has been discovered that the reaction in which silicon self-interstitial atoms react to produce agglomerated interstitial defects can be suppressed. Without being bound to any particular theory, it is believed that the concentration of self-interstitials is controlled during the growth and cooling of the crystal ingot in the process of the present invention, such that the change in free energy of the system never exceeds a critical value at which the agglomeration reaction spontaneously occurs to produce agglomerated interstitial defects.

In general, the change in system free energy available to drive the reaction in which agglomerated interstitial defects are formed from silicon self-interstitials in single crystal silicon is governed by Equation (I):

$$\Delta G_I = kT\ \ln\left(\frac{[I]}{[I]^{eq}}\right) \quad \text{(I)}$$

wherein $\Delta G_I$ is the change in free energy, k is the Boltzmann constant,

T is the temperature in K,

[I] is the concentration of self-interstitials at a point in space and time in the single crystal silicon, and $[I]^{eq}$ is the equilibrium concentration of self-interstitials at the same point in space and time at which [I] occurs and at the temperature, T.

According to this equation, for a given concentration of self-interstitials, [I], a decrease in the temperature, T, generally results in an increase in $\Delta G_I$ due to a sharp decrease in $[I]^{eq}$ with temperature.

Figure 2:
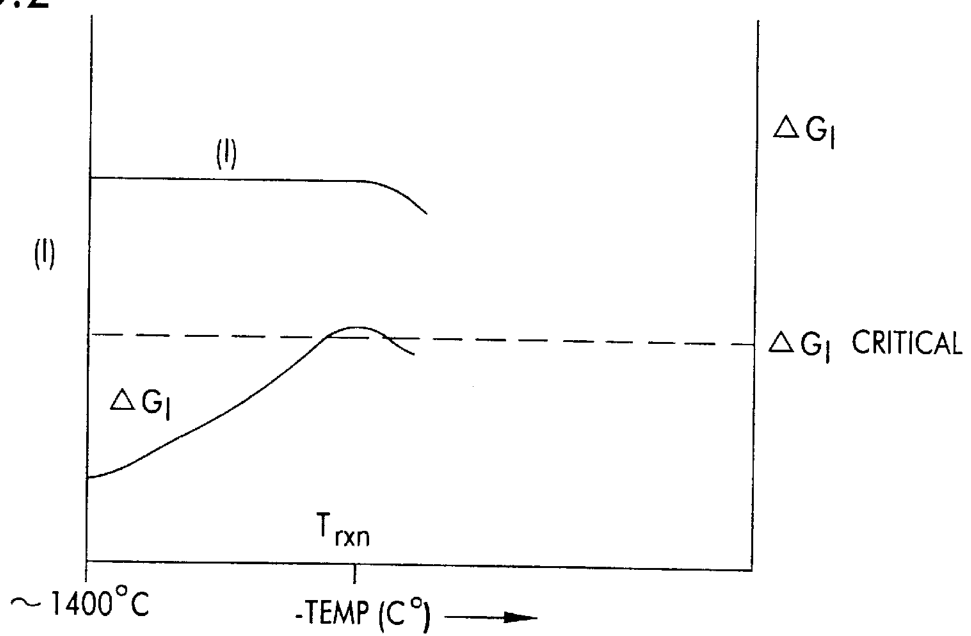
FIG. 2 is a graph which shows an example of how $\Delta G_I$, the change in free energy required for the formation of agglomerated interstitial defects, increases as the temperature, T, decreases, for a given initial concentration of self-interstitials, [I].

FIG. 2 schematically illustrates the change in $\Delta G_I$ and the concentration of silicon self-interstitials for an ingot which is cooled from the temperature of solidification without simultaneously employing some means for suppression of the concentration of silicon self-interstitials. As the ingot cools, $\Delta G_I$ increases according to Equation (I), due to the increasing supersaturation of [I], and the energy barrier for the formation of agglomerated interstitial defects is approached. As cooling continues, this energy barrier is eventually exceeded, at which point a reaction occurs. This reaction results in the formation of agglomerated interstitial defects and the concomitant decrease in $\Delta G_I$ as the supersaturated system is relaxed, i.e., as the concentration of [I] decreases.

The agglomeration of self-interstitials can be avoided as the ingot cools from the temperature of solidification by maintaining the free energy of the silicon self-interstitial system at a value which is less than that at which an agglomeration reaction will occur. In other words, the system can be controlled so as to never become critically supersaturated. This can be achieved by establishing an initial concentration of self-interstitials (controlled by $v/G_0(r)$ as hereinafter defined) which is sufficiently low such that critical supersaturation is never achieved. However, in practice such concentrations are difficult to achieve across an entire crystal radius and, in general, therefore, critical supersaturation may be avoided by suppressing the initial silicon self-interstitial concentration subsequent to crystal solidification, i.e., subsequent to establishing the initial concentration determined by $v/G_0(r)$.

Figure 3:
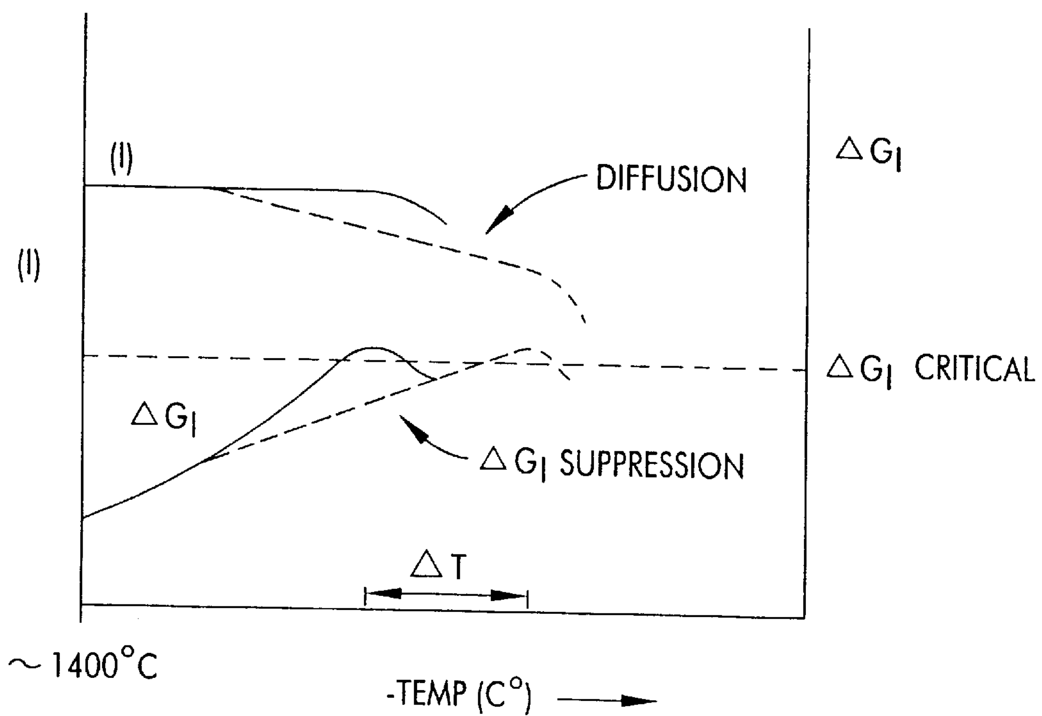
FIG. 3 is a graph which shows an example of how $\Delta G_I$, the change in free energy required for the formation of agglomerated interstitial defects, decreases (as the temperature, T, decreases) as a result of the suppression of the concentration of self-interstitials, [I], through the means of radial diffusion. The solid line depicts the case for no radial diffusion whereas the dotted line includes the effect of diffusion.
Figure 4:
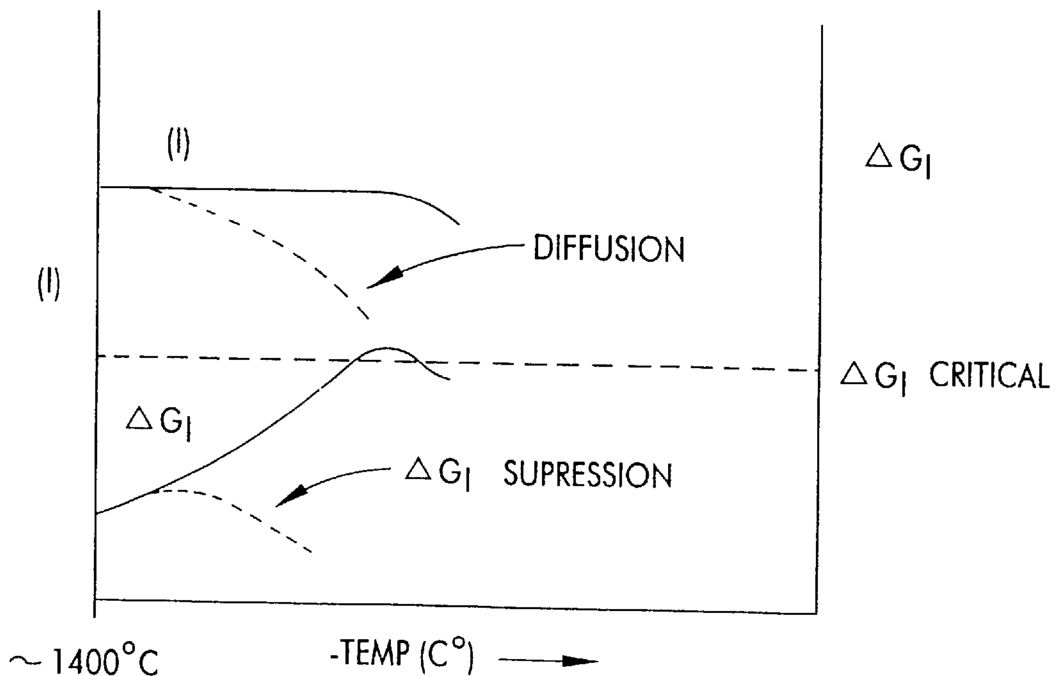
FIG. 4 is a graph which shows an example of how $\Delta G_I$, the change in free energy required for the formation of agglomerated interstitial defects, is sufficiently decreased (as the temperature, T, decreases), as a result of the suppression of the concentration of self-interstitials, [I], through the means of radial diffusion, such that an agglomeration reaction is prevented. The solid line depicts the case for no radial diffusion whereas the dotted line includes the effect of diffusion.

FIGS. 3 and 4 schematically illustrate two possible effects of suppressing [I] upon the increase in $\Delta G_I$ as the ingot of FIG. 2 is cooled from the temperature of solidification. In FIG. 3, the suppression of [I] results in a decrease in the rate of increase of $\Delta G_I$ but, in this case, the suppression is insufficient to maintain $\Delta G_I$ everywhere at a value which is less than the critical value at which the reaction occurs; as a result, the suppression merely serves to reduce the temperature at which the reaction occurs. In FIG. 4, an increased suppression of [I] is sufficient to maintain $\Delta G_I$ everywhere to a value which is less than the critical value at which the reaction occurs; the suppression, therefore, inhibits the formation of defects.

Surprisingly, it has been found that due to the relatively large mobility of self-interstitials, which is generally about $10^{-4}$ $cm^2$/second, it is possible to effect the suppression over relatively large distances, i.e. distances of about 5 cm to about 10 cm or more, by the radial diffusion of self-interstitials to sinks located at the crystal surface or to vacancy dominated regions located within the crystal. Radial diffusion can be effectively used to suppress the concentration of self-interstitials, provided sufficient time is allowed for the radial diffusion of the initial concentration of intrinsic point defects. In general, the diffusion time will depend upon the radial variation in the initial concentration of self-interstitials, with lesser radial variations requiring shorter diffusion times.

Figure 5:
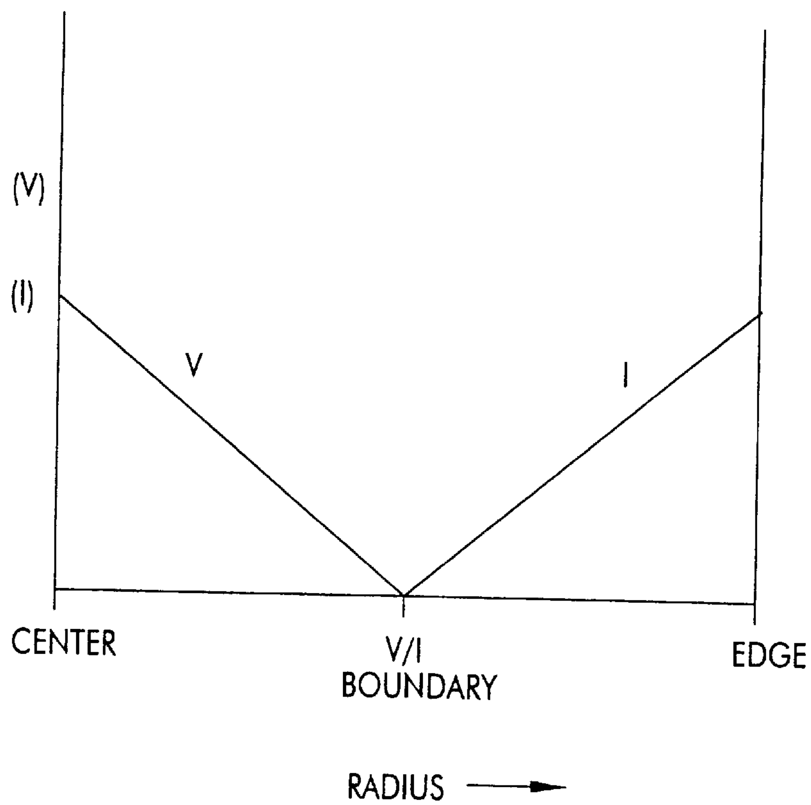
FIG. 5 is a graph which shows an example of how the initial concentration of self-interstitials, [I], and vacancies, [V], can change along the radius of an ingot or wafer, as the value of the ratio $v/G_0$ decreases, due to an increase in the value of $G_0$. Note that at the V/I boundary a transition occurs from vacancy dominated material to self-interstitial dominated material.
Figure 6:
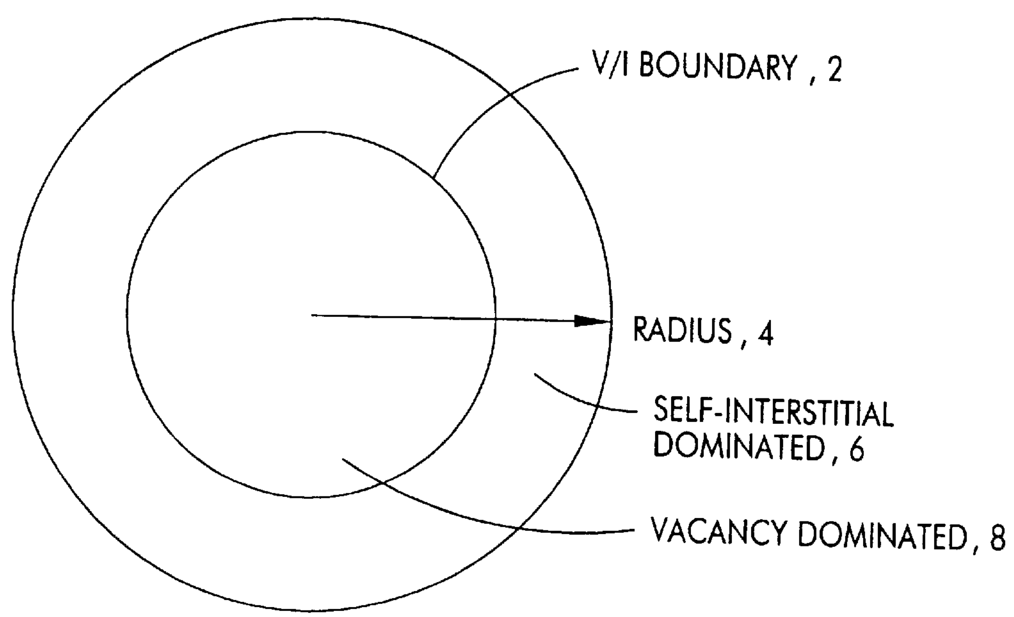
FIG. 6 is a top plan view of a single crystal silicon ingot or wafer showing regions of vacancy, V, and self-interstitial, I, dominated materials respectively, as well as the V/I boundary that exists between them.

Typically, the average axial temperature gradient, $G_0$, increases as a function of increasing radius for single crystal silicon, which is grown according to the Czochralski method. This means that the value of $v/G_0$ is typically not singular across the radius of an ingot. As a result of this variation, the type and initial concentration of intrinsic point defects is not constant. If the critical value of $v/G_0$, denoted in FIGS. 5 and 6 as the V/I boundary 2, is reached at some point along the radius 4 of the ingot, the material will switch from being vacancy dominated to self-interstitial dominated. In addition, the ingot will contain an axially symmetric region of self-interstitial dominated material 6 (in which the initial concentration of silicon self-interstitial atoms increases as a function of increasing radius), surrounding a generally cylindrical region of vacancy dominated material 8 (in which the initial concentration of vacancies decreases as a function of increasing radius).

Figure 7A:
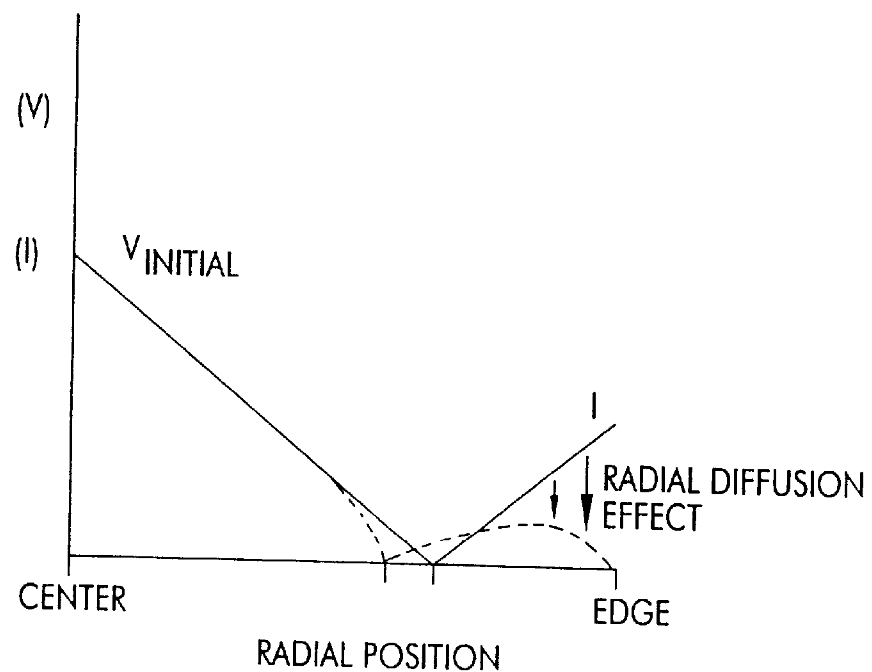
FIG. 7*a* is a graph which shows an example of how the initial concentration of vacancies or self-interstitials changes as a function of radial position due to radial diffusion of self-interstitials. Also shown is how such diffusion causes the location of the V/I boundary to move closer to the center of the ingot (as a result of the recombination of vacancies and self-interstitials), as well as the concentration of self-interstitials, [I], to be suppressed.
Figure 7B:
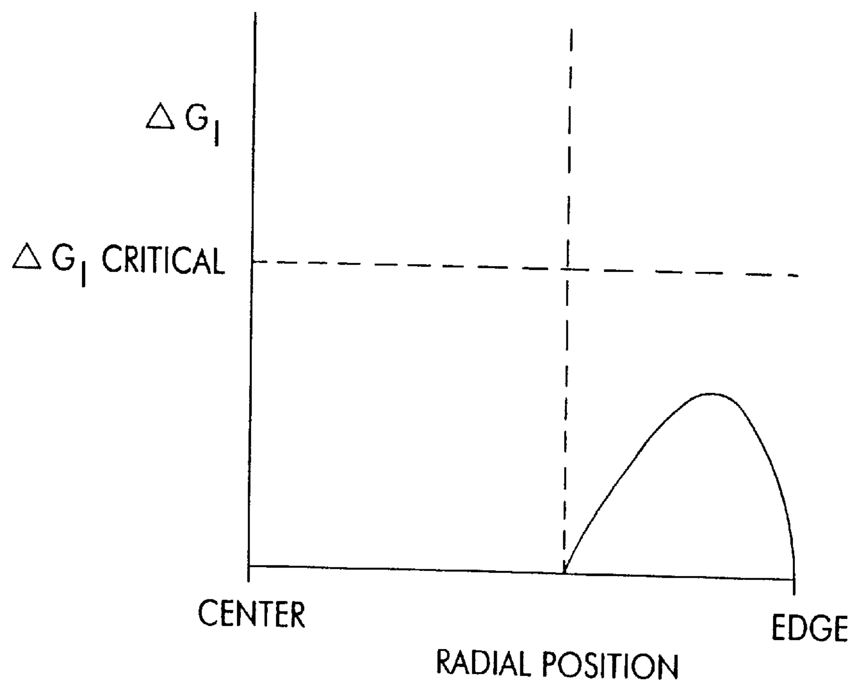
FIG. 7*b* is a graph of $\Delta G_I$, as a function of radial position which shows an example of how the suppression of self-interstitial concentration, [I], (as depicted in FIG. 7*a*) is sufficient to maintain $\Delta G_I$ everywhere to a value which is less than the critical value at which the silicon self-interstitial reaction occurs.

FIGS. 7*a* and 7*b* schematically illustrate the effect of suppressing [I] upon the increase in $\Delta G_I$ as an ingot is cooled from the temperature of solidification in accordance with one embodiment of the present invention. When the ingot is pulled in accordance with the Czochralski method, the ingot contains an axially symmetric region of interstitial dominated material extending from the edge of the ingot to the position along the radius at which the V/I boundary occurs and a generally cylindrical region of vacancy dominated material extending from the center of the ingot to the position along the radius at which the V/I boundary occurs. As the ingot is cooled from the temperature of solidification, radial diffusion of interstitial atoms causes a radially inward shift in the V/I boundary due to a recombination of self-interstitials with vacancies and a significant suppression of the self-interstitial concentration outside the V/I boundary. In addition, radial diffusion of self-interstitials to the surface of the crystal will occur as the crystal cools. The surface of the crystal is capable of maintaining near equilibrium point defect concentrations as the crystal cools. As a result, the suppression of [I] is sufficient to maintain $\Delta G_I$ everywhere to a value which is less than the critical value at which the silicon self-interstitial reaction occurs.

Figure 8:
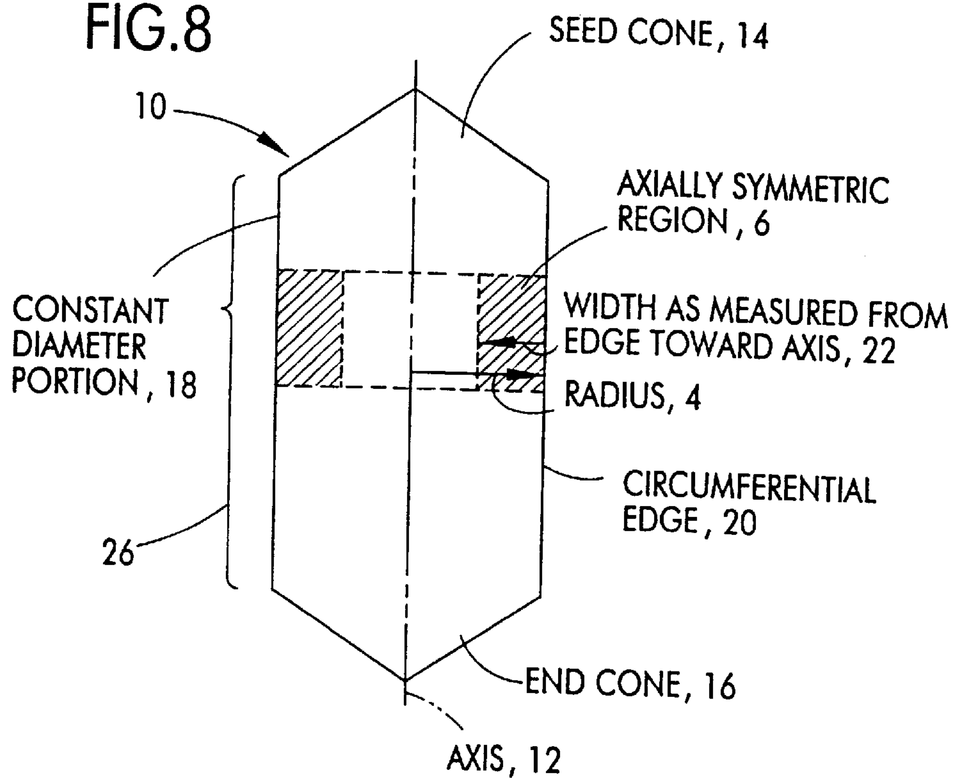
FIG. 8 is a longitudinal, cross-sectional view of a single crystal silicon ingot showing, in detail, an axially symmetric region of a constant diameter portion of the ingot.
Figure 9:
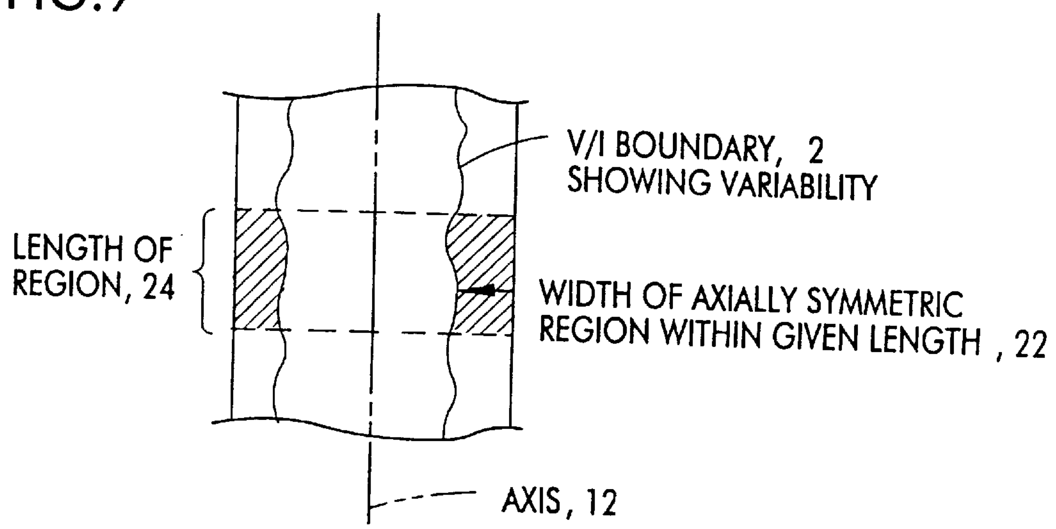
FIG. 9 is a longitudinal, cross-sectional view of a segment of a constant diameter portion of a single crystal silicon ingot, showing in detail axial variations in the width of an axially symmetric region.

Referring now to FIGS. 8 and 9, in the process of the present invention a single crystal silicon ingot 10 is grown in accordance with the Czochralski method. The silicon ingot comprises a central axis 12, a seed-cone 14, an end-cone 16 and a constant diameter portion 18 between the seed-cone and the end-cone. The constant diameter portion has a circumferential edge 20 and a radius 4 extending from the central axis to the circumferential edge. The process comprises controlling the growth conditions, including growth velocity, v, the average axial temperature gradient, $G_0$, and the cooling rate, to cause the formation of an axially symmetric region 6 which, upon cooling of the ingot from the solidification temperature, is substantially free of agglomerated intrinsic point defects.

In one embodiment, the growth conditions are controlled to maintain the V/I boundary 2 at a position which maximizes the volume of the axially symmetric region 6 relative to the volume of the constant diameter portion 18 of the ingot 10. In general, therefore, in this embodiment it is preferred that the axially symmetric region have a width 22 (as measured from the circumferential edge radially toward the central axis of the ingot) and a length 24 (as measured along the central axis of the ingot) which equals the radius 4 and length 26, respectively, of the constant diameter portion of the ingot. As a practical matter, however, operating conditions and crystal puller hardware constraints may dictate that the axially symmetric region occupy a lesser proportion of the constant diameter portion of the ingot. In general, therefore, the axially symmetric region in this embodiment preferably has a width of at least about 30%, more preferably at least about 40%, still more preferably at least about 60%, and most preferably at least about 80% of the radius of the constant diameter portion of the ingot. In addition, the axially symmetric region extends over a length of at least about 20%, preferably at least about 40%, more preferably at least about 60%, and still more preferably at least about 80% of the length of the constant diameter portion of the ingot.

Referring to FIG. 9, the width 22 of the axially symmetric region 6 may have some variation along the length of the central axis 12. For an axially symmetric region of a given length, therefore, the width is determined by measuring the distance from the circumferential edge 20 of the ingot 10 radially toward a point which is farthest from the central axis. In other words, the width 22 is measured such that the minimum distance within the given length 24 of the axially symmetric region 6 is determined.

Figure 10:
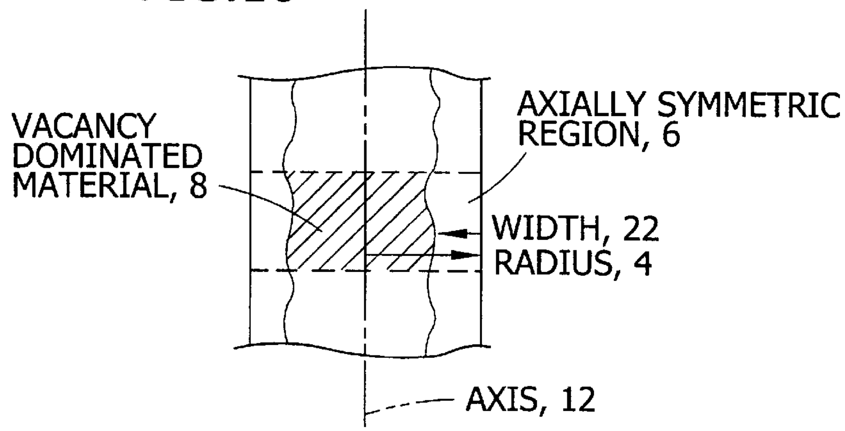
FIG. 10 is a longitudinal, cross-sectional view of a segment of a constant diameter portion of a single crystal silicon ingot having axially symmetric region of a width which is less than the radius of the ingot, showing in detail that this region further contains a generally cylindrical region of vacancy dominated material.
Figure 11:
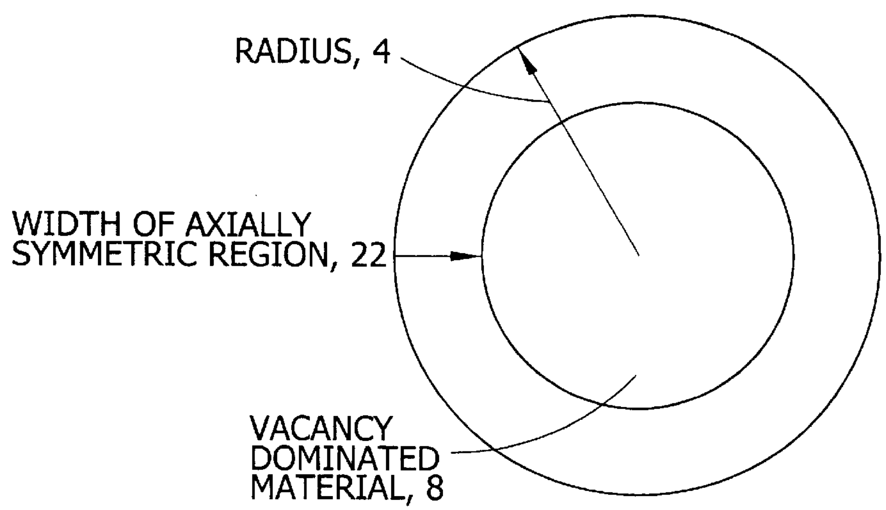
FIG. 11 is a latitudinal, cross-sectional view of the axially symmetric region depicted in FIG. 10.
Figure 12:
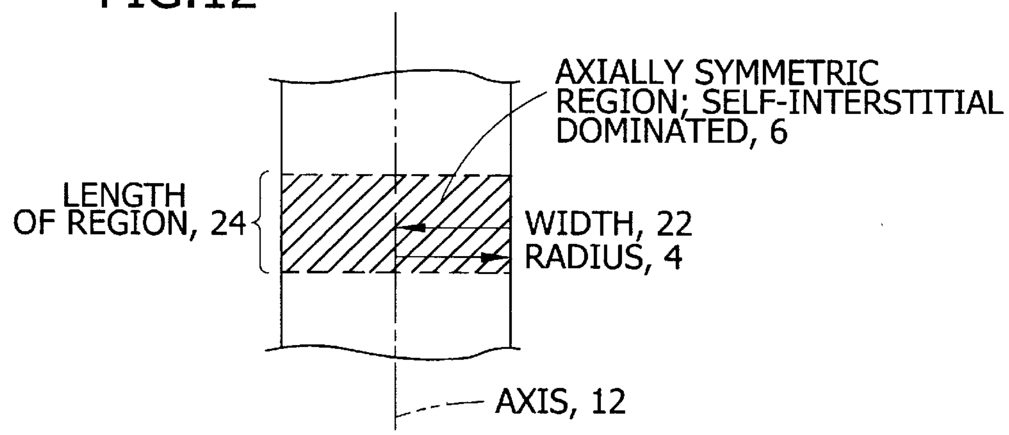
FIG. 12 is a longitudinal, cross-sectional view of a segment of a constant diameter portion of a single crystal silicon ingot having an axially symmetric region of a width which is equal to the radius of the ingot, showing in detail that this region is a generally cylindrical region of self-interstitial dominated material which is substantially free of agglomerated intrinsic point defects.

Referring now to FIGS. 10 and 11, when the axially symmetric region 6 of the constant diameter portion 18 of the ingot 10 has a width 22 which is less than the radius 4 of the constant diameter portion, the region is generally annular in shape. A generally cylindrical region of vacancy dominated material 8, which is centered about the central axis 12, is located radially inward of the generally annular shaped segment. Referring to FIG. 12, it is to be understood that when the width 22 of the axially symmetric region 6 is equal to the radius 4 of the constant diameter portion 18, the region does not contain this vacancy dominated region; rather, the axially symmetric region itself is generally cylindrical and contains self-interstitial dominated material which is substantially free of agglomerated intrinsic point defects.

While it is generally preferred that the crystal growth conditions be controlled to maximize the width of the interstitial dominated region, there may be limits for a given crystal puller hot zone design. As the V/I boundary is moved closer to the central crystal axis, provided the cooling conditions and $G_0(r)$ do not change, where $G_0(r)$ is the radial variation of $G_0$, the minimum amount of radial diffusion required increases. In these circumstances, there may be a minimum radius of the vacancy dominated region which is required to suppress the formation of agglomerated interstitial defects by radial diffusion.

Figure 7C:
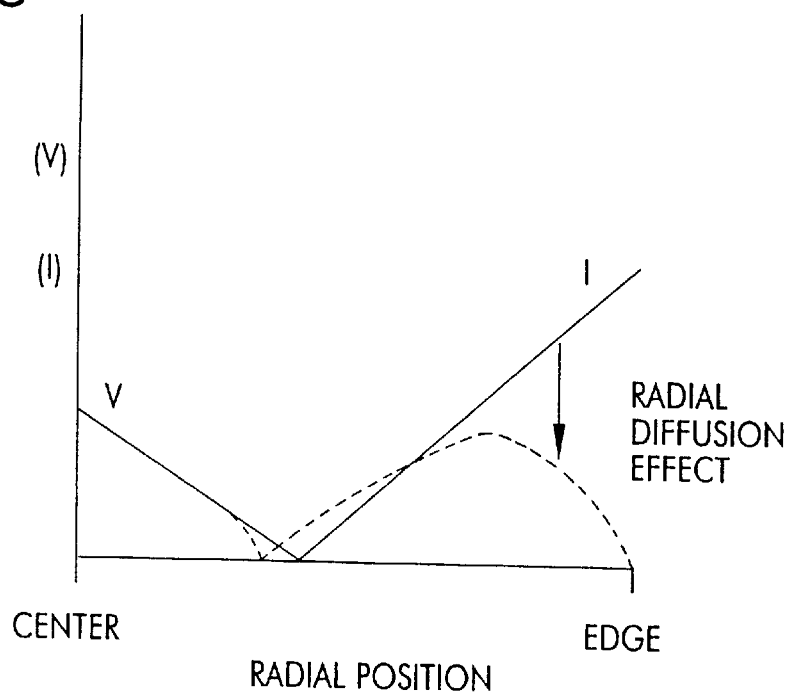
FIG. 7*c* is a graph which shows another example of how the initial concentration of vacancies or self-interstitials changes as a function of radial position due to radial diffusion of self-interstitials. Note that, in comparison to FIG. 7*a*, such diffusion caused the location of the V/I boundary to be closer to the center of the ingot (as a result of the recombination of vacancies and self-interstitials), resulting in an increase in the concentration of interstitials in the region outside of the V/I boundary.
Figure 7D:
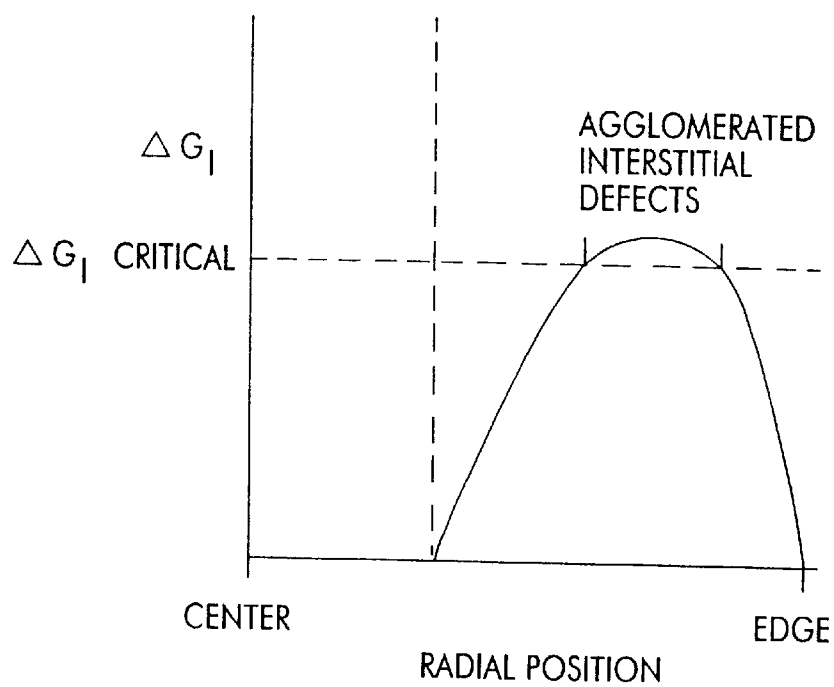
FIG. 7*d* is a graph of $\Delta G_I$ as a function of radial position which shows an example of how the suppression of self-interstitial concentration, [I], (as depicted in FIG. 7*c*) is not sufficient to maintain $\Delta G_I$ everywhere to a value which is less than the critical value at which the silicon self-interstitial reaction occurs.
Figure 7E:
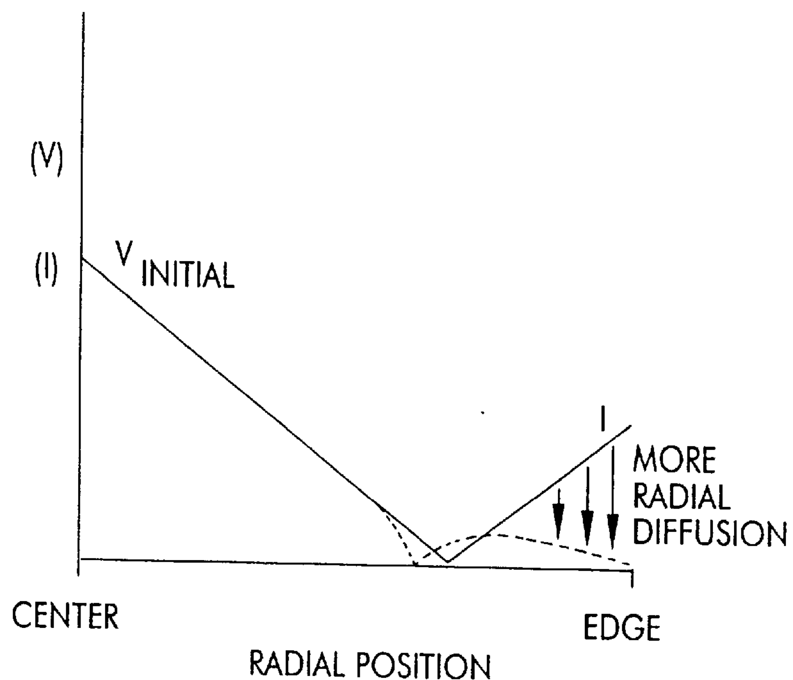
FIG. 7*e* is a graph which shows another example of how the initial concentration of vacancies or self-interstitials changes as a function of radial position due to radial diffusion of self-interstitials. Note that, in comparison to FIG. 7*a*, increased diffusion resulted in greater suppression the self-interstitial concentration.
Figure 7F:
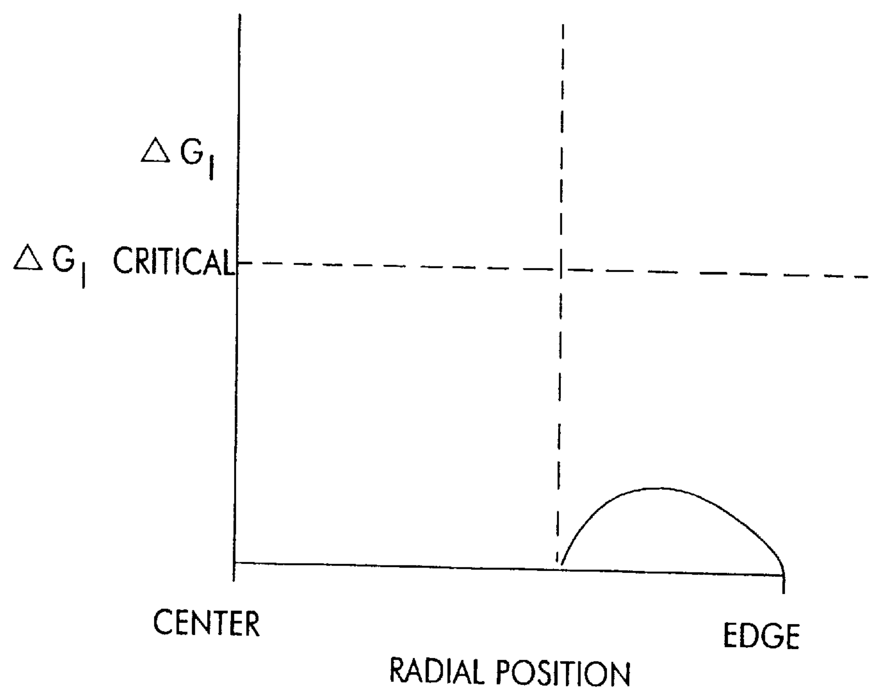
FIG. 7*f* is a graph of $\Delta G_I$ as a function of radial position which shows an example of how greater suppression of the self-interstitial concentration, [I], (as depicted in FIG. 7*e*) results in a greater degree of suppression in $\Delta G_I$, as compared to FIG. 7*b*.
Figure 7G:
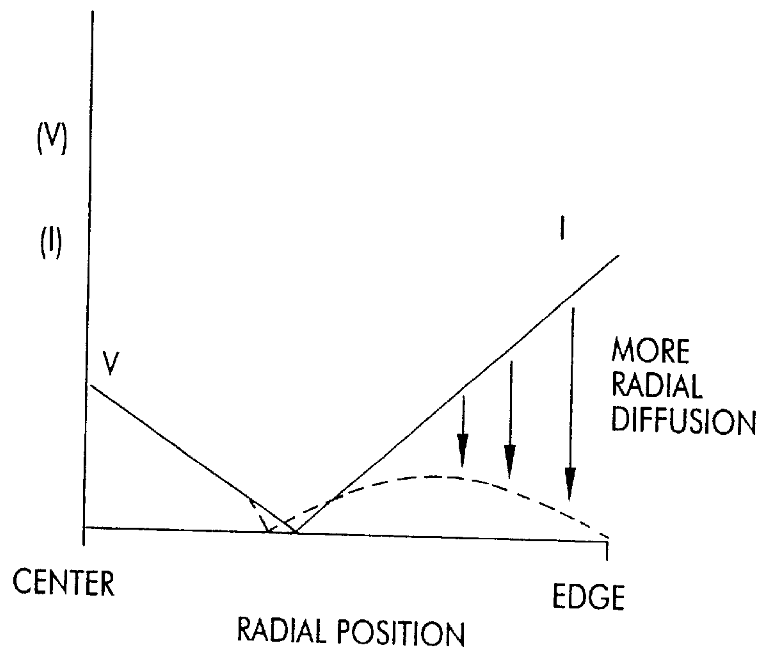
FIG. 7*g* is a graph which shows another example of how the initial concentration of vacancies or self-interstitials changes as a function of radial position due to radial diffusion of self-interstitials. Note that, in comparison to FIG. 7*c*, increased diffusion resulted in greater suppression the self-interstitial concentration.
Figure 7H:
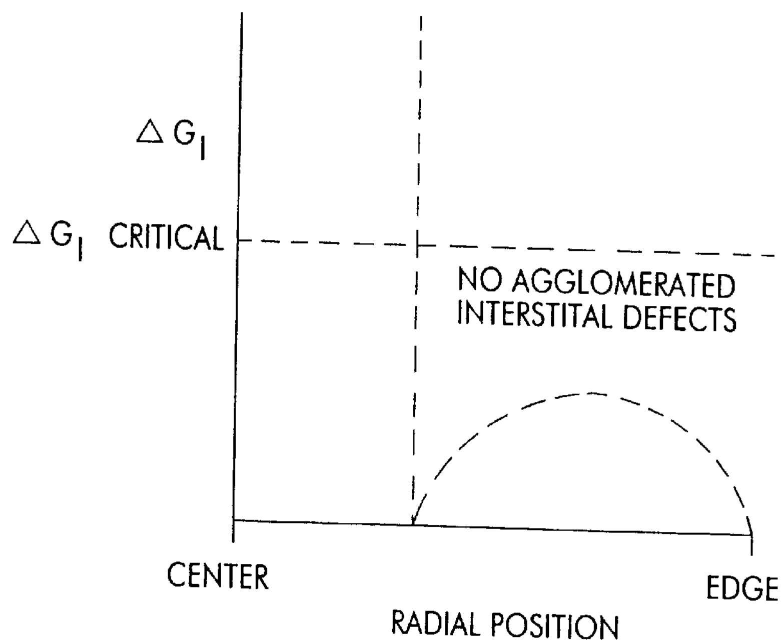
FIG. 7*h* is a graph of $\Delta G_I$ as a function of radial position which shows an example of how greater suppression of the self-interstitial concentration, [I], (as depicted in FIG. 7*g*) results in a greater degree of suppression in $\Delta G_I$, as compared to FIG. 7*d*.

FIGS. 7*c* and 7*d* schematically illustrate an example in which the minimum radius of the vacancy dominated region is exceeded. In this example, the cooling conditions and $G_0(r)$ are the same as those employed for the crystal of FIGS. 7*a* and 7*b* in which there was sufficient outdiffusion to avoid agglomerated interstitial defects for the position of the V/I boundary illustrated. In FIGS. 7*c* and 7*d*, the position of the V/I boundary is moved closer to the central axis (relative to FIGS. 7*a* and 7*b*) resulting in an increase in the concentration of interstitials in the region outside of the V/I boundary. As a result, more radial diffusion is required to sufficiently suppress the interstitial concentration. If sufficient outdiffusion is not achieved, the system $\Delta G_I$ will increase beyond the critical value and the reaction which produces agglomerated interstitial defects will occur, producing a region of these defects in an annular region between the V/I boundary and the edge of the crystal. The radius of the V/I boundary at which this occurs is the minimum radius for the given hot zone. This minimum radius is decreased if more radial diffusion of interstitials is allowed.

FIGS. 7*e*, 7*f*, 7*g* and 7*h* illustrate the effect of an increased radial outdiffusion on interstitial concentration profiles and the rise of system $\Delta G_I$ for a crystal grown with the same initial vacancy and interstitial concentration profiles as the crystal exemplified in FIGS. 7*a*, 7*b*, 7*c* and 7*d*. Increased radial diffusion of interstitials results in a greater suppression of interstitial concentration, thus suppressing the rise in the system $\Delta G_I$ to a greater degree than in FIGS. 7*a*, 7*b*, 7*c* and 7*d*. In this case the system $\Delta G_I$ is not exceeded for the smaller radius of the V/I boundary.

Figure 7I:
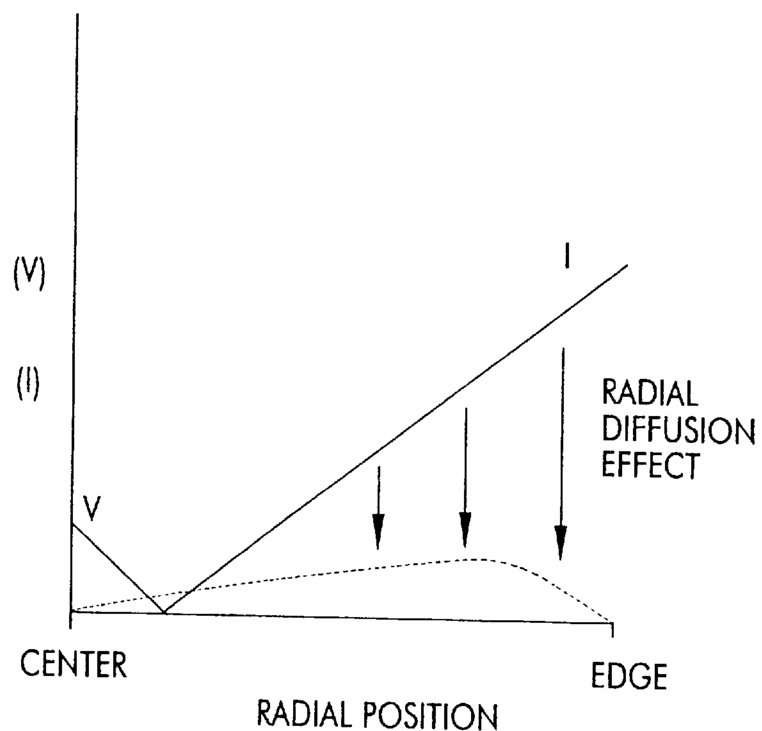
FIG. 7*i* is a graph which shows another example of how the initial concentration of vacancies or self-interstitials changes as a function of radial position due to radial diffusion of self-interstitials. Note that in this example a sufficient quantity of self-interstitials recombine with vacancies, such that there is no longer a vacancy-dominated region.
Figure 7J:
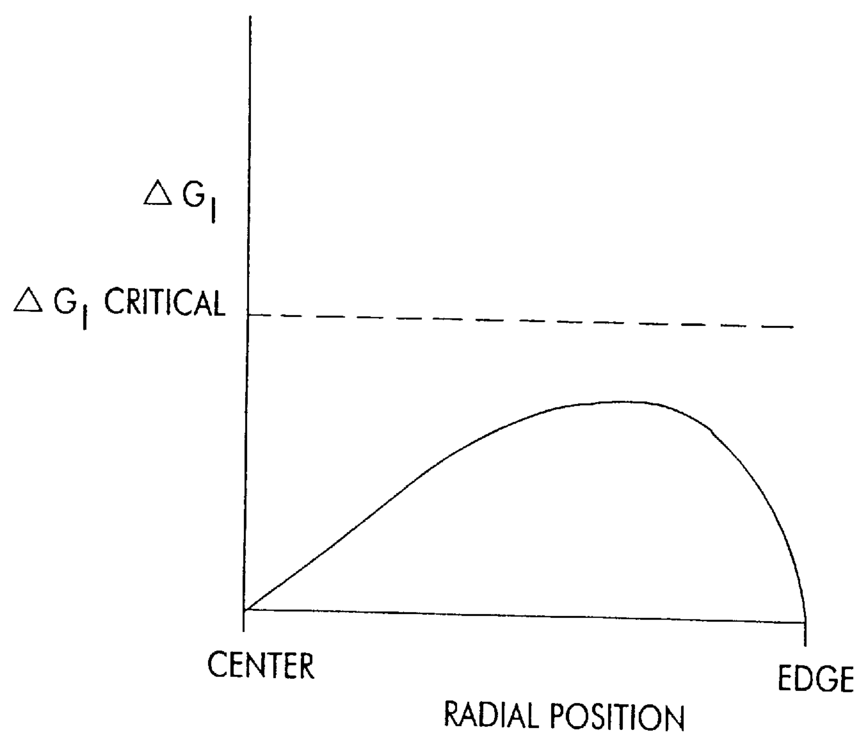
FIG. 7*j* is a graph of $\Delta G_I$ as a function of radial position which shows an example of how radial diffusion of self-interstitials (as depicted in FIG. 7*i*) is sufficient to maintain a suppression of agglomerated interstitial defects everywhere along the crystal radius.

FIGS. 7*i* and 7*j* illustrate an example in which sufficient radial diffusion is allowed such that the minimum radius is reduced to zero by insuring sufficient radial diffusion to achieve a suppression of agglomerated interstitial defects everywhere along the crystal radius.

In one embodiment of the process of the present invention, the initial concentration of silicon self-interstitial atoms is controlled in the axially symmetric, self-interstitial dominated region of the ingot. Referring again to FIG. 1, in general, the initial concentration of silicon self-interstitial atoms is controlled by controlling the crystal growth velocity, v, and the average axial temperature gradient, $G_0$, such that the value of the ratio $v/G_0$ is relatively near the critical value of this ratio, at which the V/I boundary occurs. In addition, the average axial temperature gradient, $G_0$, can be established such that the variation of $G_0$, i.e. $G_0(r)$, (and thus, $v/G_0(r)$) as a function of the ingot radius is also controlled.

The growth velocity, v, and the average axial temperature gradient, $G_0$, (as previously defined) are typically controlled such that the ratio $v/G_0$ ranges in value from about 0.5 to about 2.5 times the critical value of $v/G_0$ (i.e., about $1\times10^{-5}$ $cm^2/sK$ to about $5\times10^{-5}$ $cm^2/sK$ based upon currently available information for the critical value of $v/G_0$). Preferably, the ratio $v/G_0$ will range in value from about 0.6 to about 1.5 times the critical value of $v/G_0$ (i.e., about $1.3\times10^{-5}$ $cm^2/sK$ to about $3\times10^{-5}$ $cm^2/sK$ based upon currently available information for the critical value of $v/G_0$). Most preferably, the ratio $v/G_0$ will range in value from about 0.75 to about 1 times the critical value of $v/G_0$ (i.e., about $1.6\times10^{-5}$ $cm^2/sK$ to about $2.1\times10^{-5}$ $cm^2/sK$ based upon currently available information for the critical value of $v/G_0$). These ratios are achieved by independent control of the growth velocity, v, and the average axial temperature gradient, $G_0$.

In general, control of the average axial temperature gradient, $G_0$, may be achieved primarily through the design of the "hot zone" of the crystal puller, i.e. the graphite (or other materials) that makes up the heater, insulation, heat and radiation shields, among other things. Although the design particulars may vary depending upon the make and model of the crystal puller, in general, $G_0$ may be controlled using any of the means currently known in the art for controlling heat transfer at the melt/solid interface, including reflectors, radiation shields, purge tubes, light pipes, and heaters. In general, radial variations in $G_0$ are minimized by positioning such an apparatus within about one crystal diameter above the melt/solid interface. $G_0$ can be controlled further by adjusting the position of the apparatus relative to the melt and crystal. This is accomplished either by adjusting the position of the apparatus in the hot zone, or by adjusting the position of the melt surface in the hot zone. In addition, when a heater is employed, $G_0$ may be further controlled by adjusting the power supplied to the heater. Any, or all, of these methods can be used during a batch Czochralski process in which melt volume is depleted during the process.

It is generally preferred for some embodiments of the present invention that the average axial temperature gradient, $G_0$, be relatively constant as a function of diameter of the ingot. However, it should be noted that as improvements in hot zone design allow for variations in $G_0$ to be minimized, mechanical issues associated with maintaining a constant growth rate become an increasingly important factor. This is because the growth process becomes much more sensitive to any variation in the pull rate, which in turn directly effects the growth rate, v. In terms of process control, this means that it is favorable to have values for $G_0$ which differ over the radius of the ingot. Significant differences in the value of $G_0$, however, can result in a large concentration of self-interstitials generally increasing toward the wafer edge and, thereby, increase the difficultly in avoiding the formation of agglomerated intrinsic point defects.

In view of the foregoing, the control of $G_0$ involves a balance between minimizing radial variations in $G_0$ and maintaining favorable process control conditions. Typically, therefore, the pull rate after about one diameter of the crystal length will range from about 0.2 mm/minute to about 0.8 mm/minute. Preferably, the pull rate will range from about 0.25 mm/minute to about 0.6 mm/minute and, more preferably, from about 0.3 mm/minute to about 0.5 mm/minute. It is to be noted that the pull rate is dependent upon both the crystal diameter and crystal puller design. The stated ranges are typical for 200 mm diameter crystals. In general, the pull rate will decrease as the crystal diameter increases. However, the crystal puller may be designed to allow pull rates in excess of those stated here. As a result, most preferably the crystal puller will be designed to enable the pull rate to be as fast as possible while still allowing for the formation of an axially symmetric region in accordance with the present invention.

In a second and preferred embodiment, the amount of self-interstitial diffusion is controlled by controlling the cooling rate as the ingot is cooled from the solidification temperature (about 1410° C.) to the temperature at which silicon self-interstitials become immobile, for commercially practical purposes. Silicon self-interstitials appear to be extremely mobile at temperatures near the solidification temperature of silicon, i.e. about 1410° C. This mobility, however, decreases as the temperature of the single crystal silicon ingot decreases. Generally, the diffusion rate of self-interstitials slows such a considerable degree that they are essentially immobile for commercially practical time periods at temperatures less than about 700° C., and perhaps at temperatures as great as 800° C., 900° C., 1000° C., or even 1050° C.

It is to be noted in this regard that, although the temperature at which a self-interstitial agglomeration reaction occurs may in theory vary over a wide range of temperatures, as a practical matter this range appears to be relatively narrow for conventional, Czochralski grown silicon. This is a consequence of the relatively narrow range of initial self-interstitial concentrations which are typically obtained in silicon grown according to the Czochralski method. In general, therefore, a self-interstitial agglomeration reaction may occur, if at all, at temperatures within the range of about 1100° C. to about 800° C., and typically at a temperature of about 1050° C.

Figure 24:
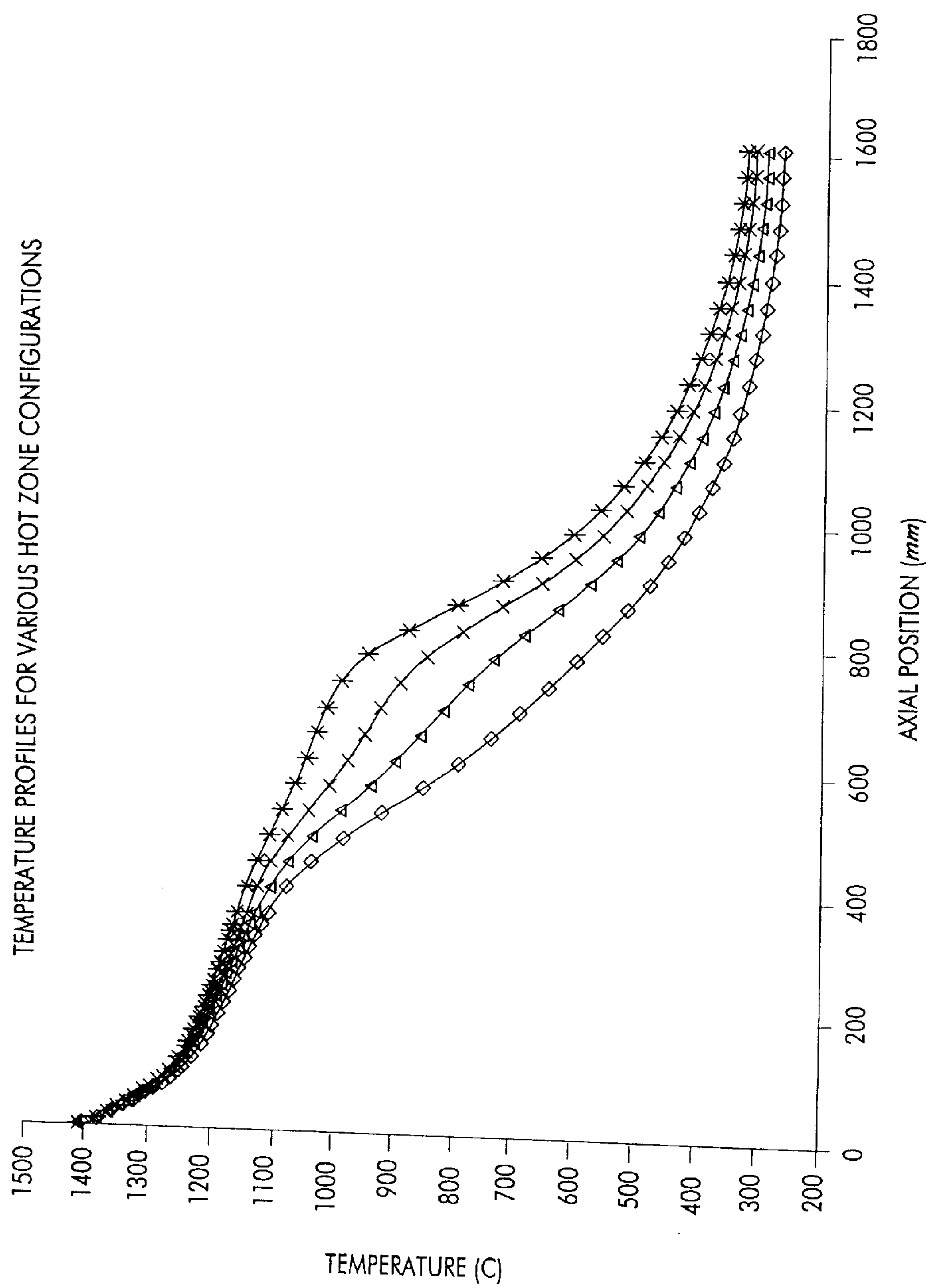
FIG. 24 is a graph illustrating the axial temperature profile for an ingot in four different hot zone configurations.

Within the range of temperatures at which self-interstitials appear to be mobile, and depending upon the temperature in the hot zone, the cooling rate will typically range from about 0.1° C./minute to about 3° C./minute. Preferably, the cooling rate will range from about 0.1° C./minute to about 1.5° C./minute, more preferably from about 0.1° C./minute to about 1° C./minute, and still more preferably from about 0.1° C./minute to about 0.5° C./minute. Stated another way, to maximize the width of the axially symmetric region it is generally preferred that the silicon reside at a temperature in excess of about 1050° C. for a period of (i) at least about 5 hours, preferably at least about 10 hours, and more preferably at least about 15 hours for 150 mm nominal diameter silicon crystals, (ii) at least about 5 hours, preferably at least about 10 hours, more preferably at least about 20 hours, still more preferably at least about 25 hours, and most preferably at least about 30 hours for 200 mm nominal diameter silicon crystals, and (iii) at least about 20 hours, preferably at least about 40 hours, more preferably at least about 60 hours, and most preferably at least about 75 hours for silicon crystals having a nominal diameter greater than 200 mm. Referring to FIG. 24, as can be seen from these axial temperature profiles for different hot zone configurations, control of the cooling rate can be achieved by using any means currently known in the art for minimizing heat transfer in the hot zone, including the use of insulators, heaters, radiation shields, and magnetic fields.

By controlling the cooling rate of the ingot within a range of temperatures in which self-interstitials appear to be mobile, the self-interstitials may be given more time to diffuse to sinks located at the crystal surface, or to vacancy dominated regions, where they may be annihilated. The concentration of such interstitials may therefore be suppressed, which act to prevent an agglomeration event from occurring. Utilizing the diffusivity of interstitials by controlling the cooling rate acts to relax the otherwise stringent $v/G_0$ requirements that may be required in order to obtain an axially symmetric region free of agglomerated defects. Stated another way, as a result of the fact that the cooling rate may be controlled in order to allow interstitials more time to diffuse, a large range of $v/G_0$ values, relative to the critical value, are acceptable for purposes of obtaining an axially symmetric region free of agglomerated defects.

To achieve such cooling rates over appreciable lengths of the constant diameter portion of the crystal, consideration must also be given to the growth process of the end-cone of the ingot, as well as the treatment of the ingot once end-cone growth is complete. Typically, upon completion of the growth of the constant diameter portion of the ingot, the pull rate will be increased in order to begin the tapering necessary to form the end-cone. However, such an increase in pull rate will result in the lower segment of the constant diameter portion cooling more quickly within the temperature range in which interstitials are sufficiently mobile, as discussed above. As a result, these interstitials may not have sufficient time to diffuse to sinks to be annihilated; that is, the concentration in this lower segment may not be suppressed to a sufficient degree and agglomeration of interstitial defects may result.

In order to prevent the formation of such defects from occurring in this lower segment of the ingot, it is therefore preferred that constant diameter portion of the ingot have a uniform thermal history in accordance with the Czochralski method. A uniform thermal history may be achieved by pulling the ingot from the silicon melt at a relatively constant rate during the growth of not only the constant diameter portion, but also during the growth of the end-cone of the crystal and possibly subsequent to growth of the end-cone. The relatively constant rate may be achieved, for example, by (i) reducing the rates of rotation of the crucible and crystal during the growth of the end-cone relative to the crucible and crystal rotation rates during the growth of the constant diameter portion of the crystal, and/or (ii) increasing the power supplied to the heater used to heat the silicon melt during the growth of the end-cone relative to the power conventionally supplied during end-cone growth. These additional adjustments of the process variables may occur either individually or in combination.

When the growth of the end-cone is initiated, a pull rate for the end-cone is established such that, any segment of the constant diameter portion of the ingot which remains at a temperature in excess of about 1050° C. experiences the same thermal history as other segment(s) of the constant diameter portion of the ingot which contain an axially symmetric region free of agglomerated intrinsic point defects which have already cooled to a temperature of less than about 1050° C.

As previously noted, a minimum radius of the vacancy dominated region exists for which the suppression of agglomerated interstitial defects may be achieved. The value of the minimum radius depends on $v/G_0(r)$ and the cooling rate. As crystal puller and hot zone designs will vary, the ranges presented above for $v/G_0(r)$, pull rate, and cooling rate will also vary. Likewise these conditions may vary along the length of a growing crystal. Also as noted above, the width of the interstitial dominated region free of agglomerated interstitial defects is preferably maximized. Thus, it is desirable to maintain the width of this region to a value which is as close as possible to, without exceeding, the difference between the crystal radius and the minimum radius of the vacancy dominated region along the length of the growing crystal in a given crystal puller.

The optimum width of the axially symmetric region and the required optimal crystal pulling rate profile for a given crystal puller hot zone design may be determined empirically. Generally speaking, this empirical approach involves first obtaining readily available data on the axial temperature profile for an ingot grown in a particular crystal puller, as well as the radial variations in the average axial temperature gradient for an ingot grown in the same puller. Collectively, this data is used to pull one or more single crystal silicon ingots, which are then analyzed for the presence of agglomerated interstitial defects. In this way, an optimum pull rate profile can be determined.

Figure 13:
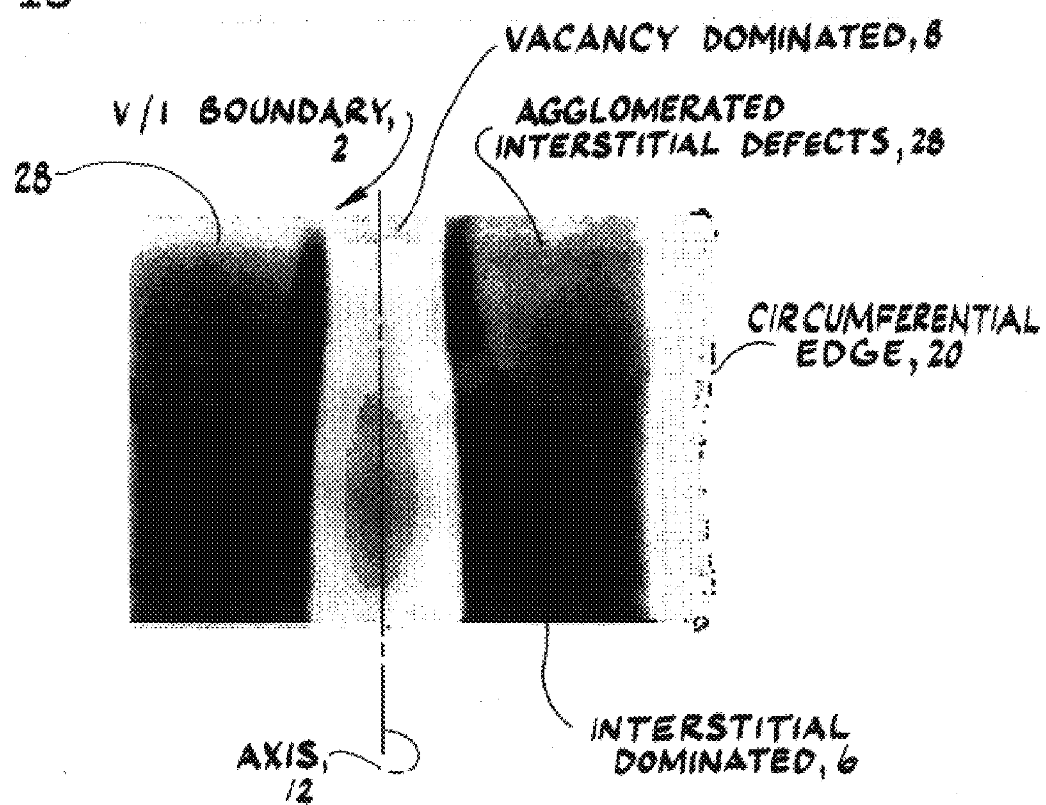
FIG. 13 is an image produced by a scan of the minority carrier lifetime of an axial cut of the ingot following a series of oxygen precipitation heat treatments, showing in detail a generally cylindrical region of vacancy dominated material, a generally annular shaped axially symmetric region of self-interstitial dominated material, the V/I boundary present between them, and a region of agglomerated interstitial defects.

FIG. 13 is an image produced by a scan of the minority carrier lifetime of an axial cut of a section of a 200 mm diameter ingot following a series of oxygen precipitation heat-treatments which reveal defect distribution patterns. It depicts an example in which a near-optimum pull rate profile is employed for a given crystal puller hot zone design. In this example, a transition occurs from a $v/G_0(r)$ at which the maximum width of the interstitial dominated region is exceeded (resulting in the generation of regions of agglomerated interstitial defects 28) to an optimum $v/G_0(r)$ at which the axially symmetric region has the maximum width.

In addition to the radial variations in $v/G_0$ resulting from an increase in $G_0$ over the radius of the ingot, $v/G_0$ may also vary axially as a result of a change in v, or as a result of natural variations in $G_0$ due to the Czochralski process. For a standard Czochralski process, v is altered as the pull rate is adjusted throughout the growth cycle, in order to maintain the ingot at a constant diameter. These adjustments, or changes, in the pull rate in turn cause $v/G_0$ to vary over the length of the constant diameter portion of the ingot. In accordance with the process of the present invention, the pull rate is therefore controlled in order to maximize the width of the axially symmetric region of the ingot. As a result, however, variations in the radius of the ingot may occur. In order to ensure that the resulting ingot has a constant diameter, the ingot is therefore preferably grown to a diameter larger than that which is desired. The ingot is then subjected to processes standard in the art to remove excess material from the surface, thus ensuring that an ingot having a constant diameter portion is obtained.

For an ingot prepared in accordance with the process of the present invention and having a V/I boundary, i.e. an ingot containing material which is vacancy dominated, experience has shown that low oxygen content material, i.e., less than about 13 PPMA (parts per million atomic, ASTM standard F-121-83), is preferred. More preferably, the single crystal silicon contains less than about 12 PPMA oxygen, still more preferably less than about 11 PPMA oxygen, and most preferably less than about 10 PPMA oxygen. This is because, in medium to high oxygen contents wafers, i.e., 14 PPMA to 18 PPMA, the formation of oxygen-induced stacking faults and bands of enhanced oxygen clustering just inside the V/I boundary becomes more pronounced. Each of these are a potential source for problems in a given integrated circuit fabrication process. However, it is to be noted that, when the axially symmetric region has a width about equal to the radius of the ingot, the oxygen content restriction is removed; this is because, given that no vacancy type material is present, the formation of such faults and clusters will not to occur.

The effects of enhanced oxygen clustering may be further reduced by a number of methods, used singularly or in combination. For example, oxygen precipitate nucleation centers typically form in silicon which is annealed at a temperature in the range of about 350° C. to about 750° C. For some applications, therefore, it may be preferred that the crystal be a "short" crystal, that is, a crystal which has been grown in a Czochralski process until the seed end has cooled from the melting point of silicon (about 1410° C.) to about 750° C. after which the ingot is rapidly cooled. In this way, the time spent in the temperature range critical for nucleation center formation is kept to a minimum and the oxygen precipitate nucleation centers have inadequate time to form in the crystal puller.

Preferably, however, oxygen precipitate nucleation centers formed during the growth of the single crystal are dissolved by annealing the single crystal silicon. Provided they have not been subjected to a stabilizing heat-treatment, oxygen precipitate nucleation centers can be annealed out of silicon by rapidly heating the silicon to a temperature of at least about 875° C., and preferably continuing to increase the temperature to at least 1000° C., at least 1100° C., or more. By the time the silicon reaches 1000° C., substantially all (e.g., >99%) of such defects have annealed out. It is important that the wafers be rapidly heated to these temperatures, i.e., that the rate of temperature increase be at least about 10° C. per minute and more preferably at least about 50° C. per minute. Otherwise, some or all of the oxygen precipitate nucleation centers may be stabilized by the heat-treatment. Equilibrium appears to be reached in relatively short periods of time, i.e., on the order of about 60 seconds or less. Accordingly, oxygen precipitate nucleation centers in the single crystal silicon may be dissolved by annealing it at a temperature of at least about 875° C., preferably at least about 950° C., and more preferably at least about 1100° C., for a period of at least about 5 seconds, and preferably at least about 10 minutes.

The dissolution may be carried out in a conventional furnace or in a rapid thermal annealing (RTA) system. The rapid thermal anneal of silicon may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1200° C. in a few seconds. One such commercially available RTA furnace is the model 610 furnace available from AG Associates (Mountain View, Calif.). In addition, the dissolution may be carried out on silicon ingots or on silicon wafers, preferably wafers.

It is to be noted that wafers prepared in accordance with the present invention are suitable for use as substrates upon which an epitaxial layer may be deposited. Epitaxial deposition may be performed by means common in the art.

Furthermore, it is also to be noted that wafers prepared in accordance with the present invention are suitable for use in combination with hydrogen or argon annealing treatments, such as the treatments described in European Patent Application No. 503,816 A1.

Detection of Agglomerated Defects

Agglomerated defects may be detected by a number of different techniques. For example, flow pattern defects, or D-defects, are typically detected by preferentially etching the single crystal silicon sample in a Secco etch solution for about 30 minutes, and then subjecting the sample to microscopic inspection. (see, e.g., H. Yamagishi et al., Semicond. Sci. Technol. 7, A135 (1992)). Although standard for the detection of agglomerated vacancy defects, this process may also be used to detect agglomerated interstitial defects. When this technique is used, such defects appear as large pits on the surface of the sample when present.

Agglomerated defects may also be detected using laser scattering techniques, such as laser scattering tomography, which typically have a lower defect density detection limit that other etching techniques.

Additionally, agglomerated intrinsic point defects may be visually detect by decorating these defects with a metal capable of diffusing into the single crystal silicon matrix upon the application of heat. Specifically, single crystal silicon samples, such as wafers, slugs or slabs, may be visually inspected for the presence of such defects by first coating a surface of the sample with a composition containing a metal capable of decorating these defects, such as a concentrated solution of copper nitrate. The coated sample is then heated to a temperature between about 900° C. and about 1000° C. for about 5 minutes to about 15 minutes in order to diffuse the metal into the sample. The heat treated sample is then cooled to room temperature, thus causing the metal to become critically supersaturated and precipitate at sites within the sample matrix at which defects are present.

After cooling, the sample is first subjected to a non-defect delineating etch, in order to remove surface residue and precipitants, by treating the sample with a bright etch solution for about 8 to about 12 minutes. A typical bright etch solution comprises about 55 percent nitric acid (70% solution by weight), about 20 percent hydrofluoric acid (49% solution by weight), and about 25 percent hydrochloric acid (concentrated solution).

The sample is then rinsed with deionized water and subjected to a second etching step by immersing the sample in, or treating it with, a Secco or Wright etch solution for about 35 to about 55 minutes. Typically, the sample will be etched using a Secco etch solution comprising about a 1:2 ratio of 0.15 M potassium dichromate and hydrofluoric acid (49% solution by weight). This etching step acts to reveal, or delineate, agglomerated defects which may be present.

Definitions

As used herein, the following phrases or terms shall have the given meanings: "agglomerated intrinsic point defects" mean defects caused (i) by the reaction in which vacancies agglomerate to produce D-defects, flow pattern defects, gate oxide integrity defects, crystal originated particle defects, crystal originated light point defects, and other such vacancy related defects, or (ii) by the reaction in which self-interstitials agglomerate to produce dislocation loops and networks, and other such self-interstitial related defects; "agglomerated interstitial defects" shall mean agglomerated intrinsic point defects caused by the reaction in which silicon self-interstitial atoms agglomerate; "agglomerated vacancy defects" shall mean agglomerated vacancy point defects caused by the reaction in which crystal lattice vacancies agglomerate; "radius" means the distance measured from a central axis to a circumferential edge of a wafer or ingot; "substantially free of agglomerated intrinsic point defects" shall mean a concentration of agglomerated defects which is less than the detection limit of these defects, which is currently about $10^3$ defects/cm$^3$; "V/I boundary" means the position along the radius of an ingot or wafer at which the material changes from vacancy dominated to self-interstitial dominated; and "vacancy dominated" and "self-interstitial dominated" mean material in which the intrinsic point defects are predominantly vacancies or self-interstitials, respectively.

EXAMPLES

As the following examples illustrate, the present invention affords a process for preparing a single crystal silicon ingot in which, as the ingot cools from the solidification temperature in accordance with the Czochralski method, the agglomeration of intrinsic point defects is prevented within an axially symmetric region of the constant diameter portion of the ingot, from which wafers may be sliced.

The following examples set forth one set of conditions that may be used to achieve the desired result. Alternative approaches exist for determining an optimum pull rate profile for a given crystal puller. For example, rather than growing a series of ingots at various pull rates, a single crystal could be grown at pull rates which increase and decrease along the length of the crystal; in this approach, agglomerated self-interstitial defects would be caused to appear and disappear multiple times during growth of a single crystal. Optimal pull rates could then be determined for a number of different crystal positions. Accordingly, the following examples should not be interpreted in a limiting sense.

Example 1

Figure 14:
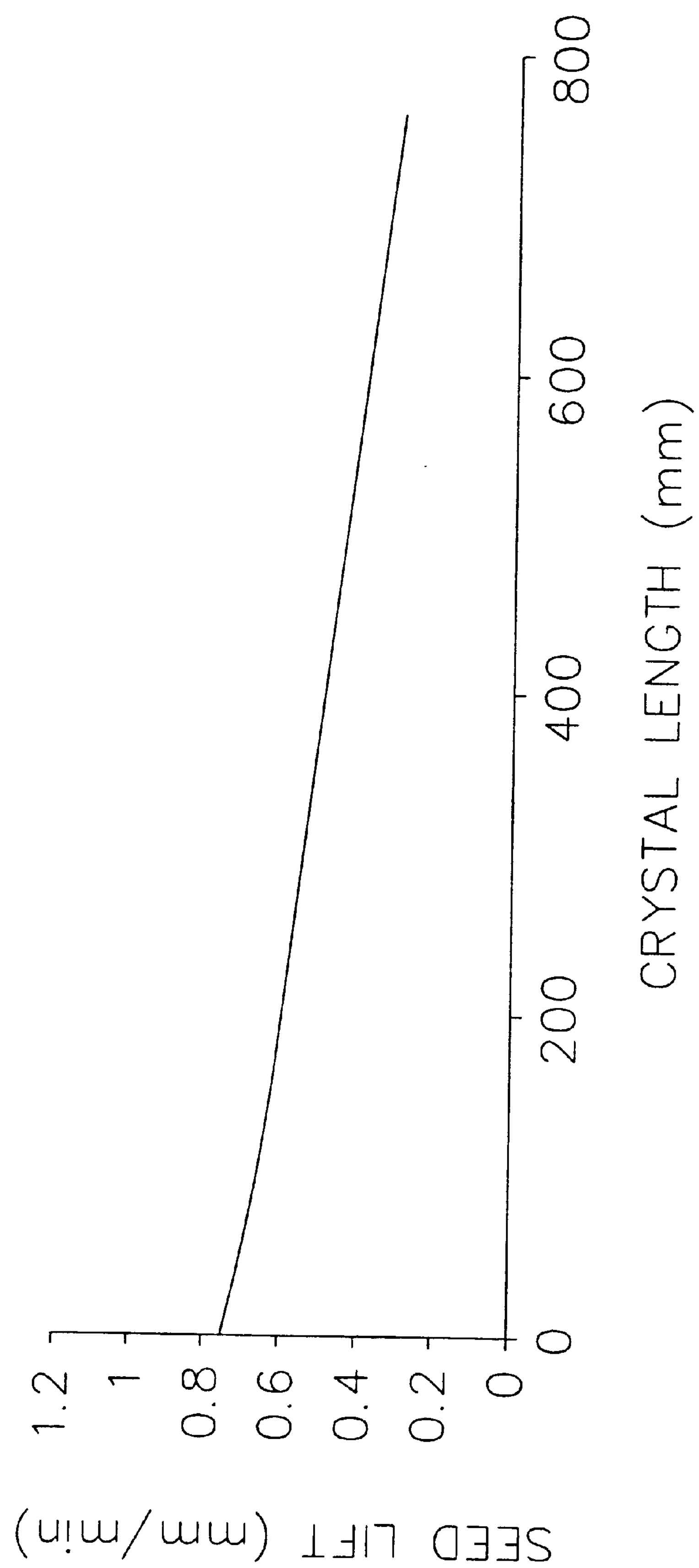
FIG. 14 is a graph of pull rate (i.e. seed lift) as a function of crystal length, showing how the pull rate is decreased linearly over a portion of the length of the crystal.

Optimization Procedure for a Crystal Puller Having a Pre-existing Hot Zone Design A first 200 mm single crystal silicon ingot was grown under conditions in which the pull rate was ramped linearly from about 0.75 mm/min. to about 0.35 mm/min. over the length of the crystal. FIG. 14 shows the pull rate as a function of crystal length. Taking into account the pre-established axial temperature profile of a growing 200 mm ingot in the crystal puller and the pre-established radial variations in the average axial temperature gradient, $G_0$, i.e., the axial temperature gradient at the melt/solid interface, these pull rates were selected to insure that ingot would be vacancy dominated material from the center to the edge at one end of the ingot and interstitial dominated material from the center to the edge of the other end of the ingot. The grown ingot was sliced longitudinally and analyzed to determine where the formation of agglomerated interstitial defects begins.

Figure 15:
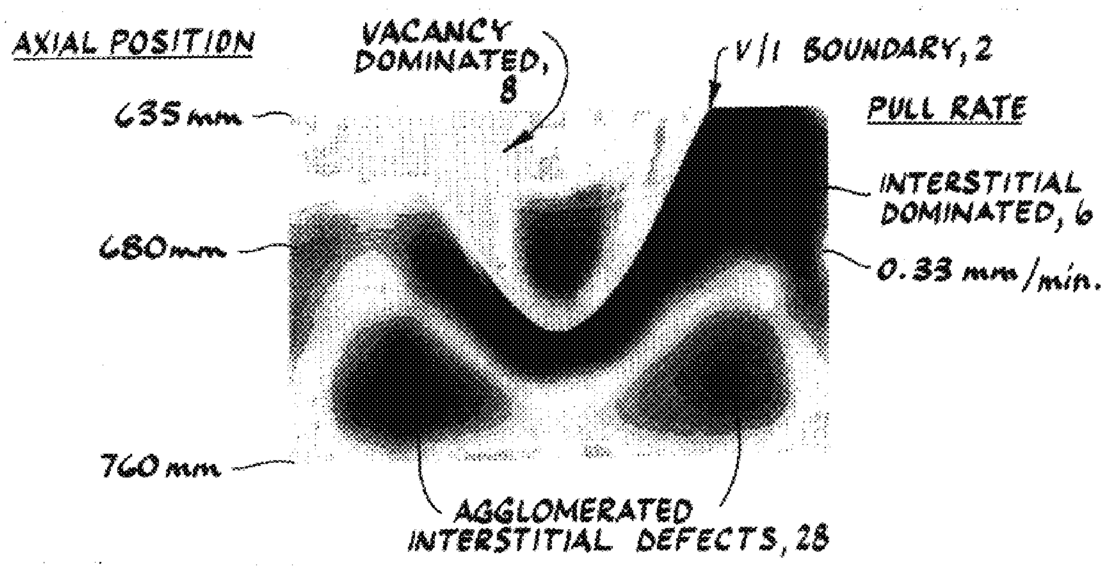
FIG. 15 is an image produced by a scan of the minority carrier lifetime of an axial cut of the ingot following a series of oxygen precipitation heat treatments, as described in Example 1.

FIG. 15 is an image produced by a scan of the minority carrier lifetime of an axial cut of the ingot over a section ranging from about 635 mm to about 760 mm from the shoulder of the ingot following a series of oxygen precipitation heat-treatments which reveal defect distribution patterns. At a crystal position of about 680 mm, a band of agglomerated interstitial defects 28 can be seen. This position corresponds to a critical pull rate of v*(680 mm)=0.33 mm/min. At this point, the width of the axially symmetric region 6 (a region which is interstitial dominated material but which lacks agglomerated interstitial defects) is at its maximum; the width of the vacancy dominated region 8, $R_v^*(680)$ is about 35 mm and the width of the axially symmetric region, $R_I^*(680)$ is about 65 mm.

Figure 16:
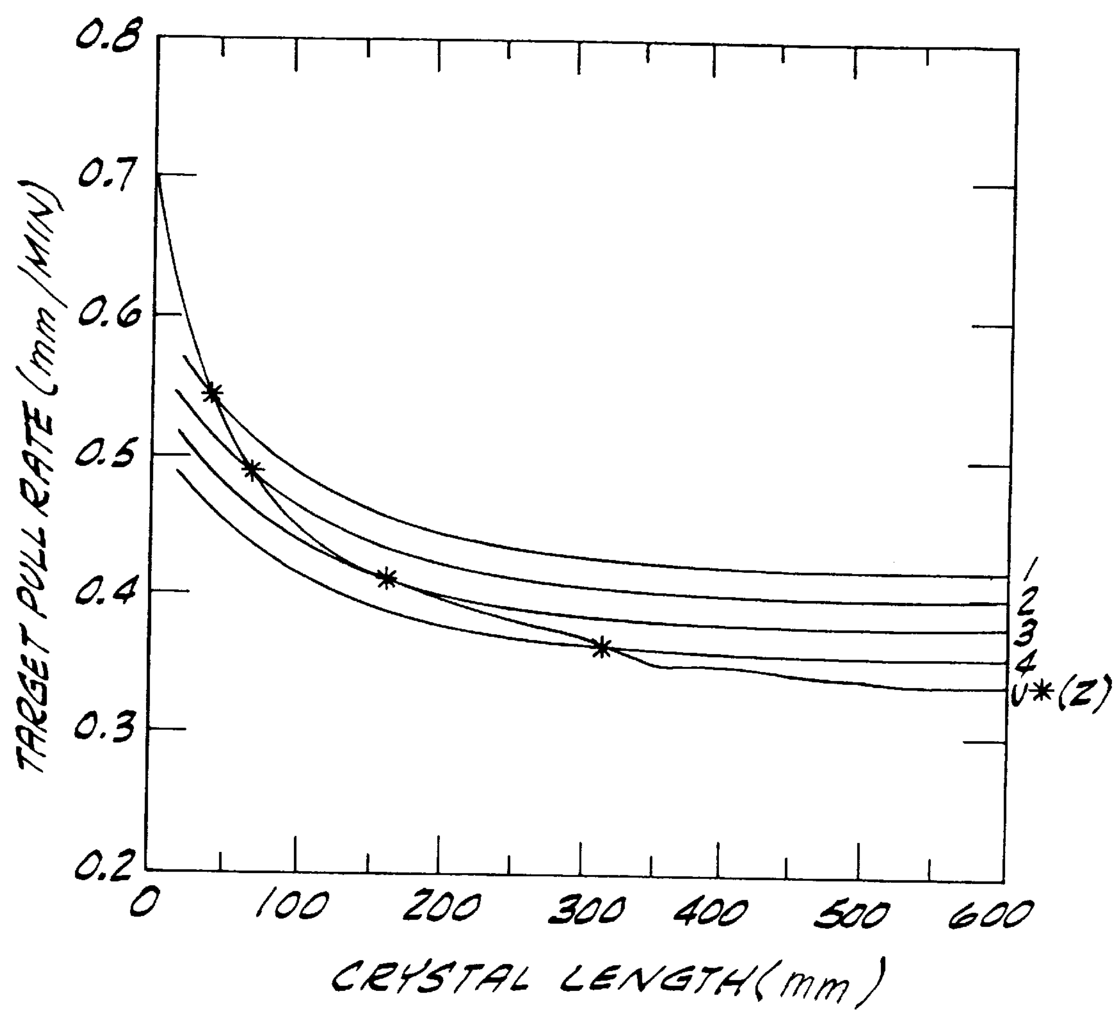
FIG. 16 is a graph of pull rate as a function of crystal length for each of four single crystal silicon ingots, labeled 1–4 respectively, which are used to yield a curve, labeled v*(Z), as described in Example 1.

A series of four single crystal silicon ingots were then grown at steady state pull rates which were somewhat greater than and somewhat less than the pull rate at which the maximum width of the axially symmetric region of the first 200 mm ingot was obtained. FIG. 16 shows the pull rate as a function of crystal length for each of the four crystals, labeled, respectively, as 1–4. These four crystals were then analyzed to determine the axial position (and corresponding pull rate) at which agglomerated interstitial defects first appear or disappear. These four empirically determined points (marked "*") are shown in FIG. 16. Interpolation between and extrapolation from these points yielded a curve, labeled v*(Z) in FIG. 16. This curve represents, to a first approximation, the pull rate for 200 mm crystals as a function of length in the crystal puller at which the axially symmetric region is at its maximum width.

Growth of additional crystals at other pull rates and further analysis of these crystals would further refine the empirical definition of v*(Z)

Example 2

Reduction of Radial Variation in $G_0(r)$

Figure 17:
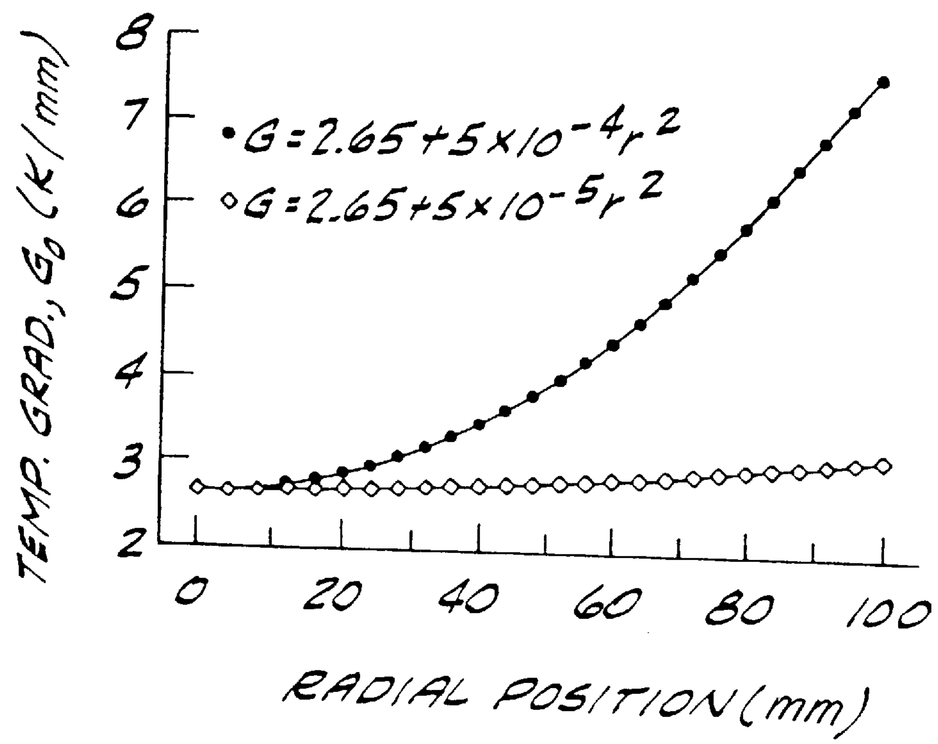
FIG. 17 is a graph of the average axial temperature gradient at the melt/solid interface, $G_0$, as a function of radial position, for two different cases as described in Example 2.
Figure 18:
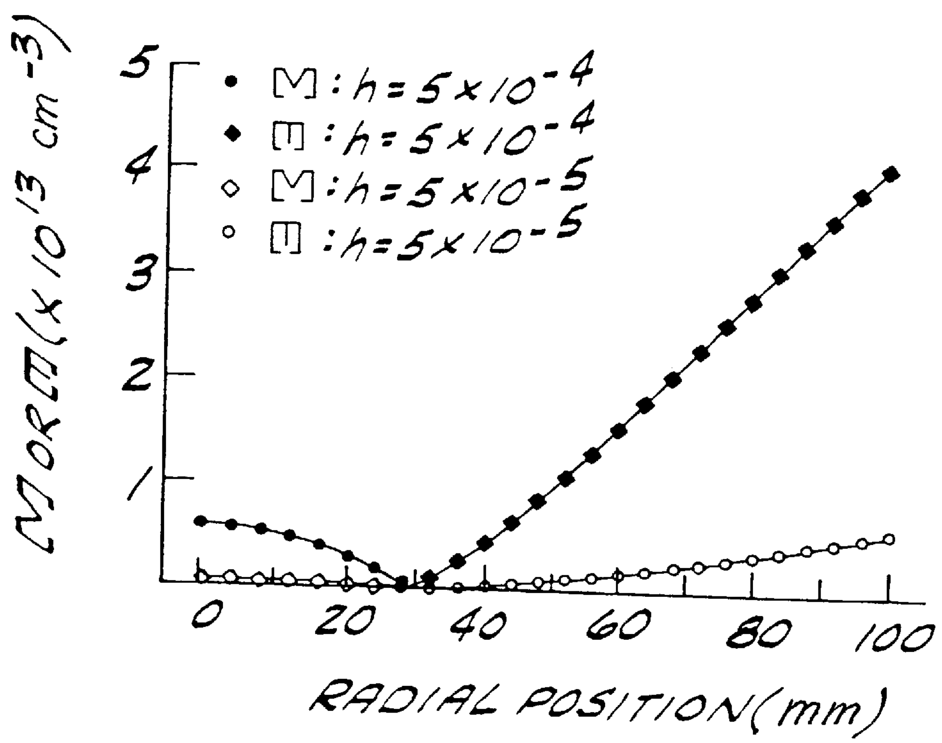
FIG. 18 is a graph of the initial concentration of vacancies, [V], or self-interstitials, [I], as a function of radial position, for two different cases as described Example 2.

FIGS. 17 and 18 illustrate the improvement in quality that can be achieved by reduction of the radial variation in the axial temperature gradient at the melt/solid interface, $G_0(r)$. The initial concentration (about 1 cm from the melt/solid interface) of vacancies and interstitials are calculated for two cases with different $G_0(r)$: (1) $G_0(r)=2.65+5\times10^{-4}r^2$ (K/mm) and (2) $G_0(r)=2.65+5\times10^{-5}r^2$ (K/mm). For each case the pull rate was adjusted such that the boundary between vacancy-rich silicon and interstitial-rich silicon is at a radius of 3 cm. The pull rate used for case 1 and 2 were 0.4 and 0.35 mm/min, respectively. From FIG. 18 it is clear that the initial concentration of interstitials in the interstitial-rich portion of the crystal is dramatically reduced as the radial variation in the initial axial temperature gradient is reduced. This leads to an improvement in the quality of the material since it becomes easier to avoid the formation of interstitial defect clusters due to supersaturation of interstitials.

Example 3

Increased Out-diffusion Time for Interstitials

Figure 19:
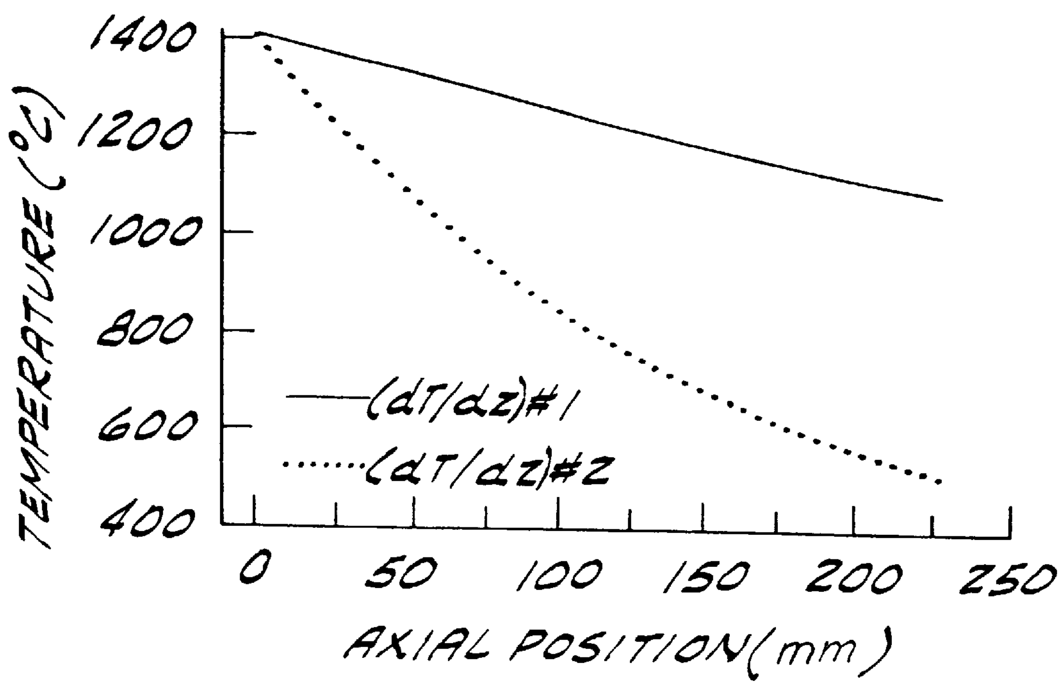
FIG. 19 is a graph of temperature as a function of axial position, showing the axial temperature profile in ingots for two different cases as described in Example 3.
Figure 20:
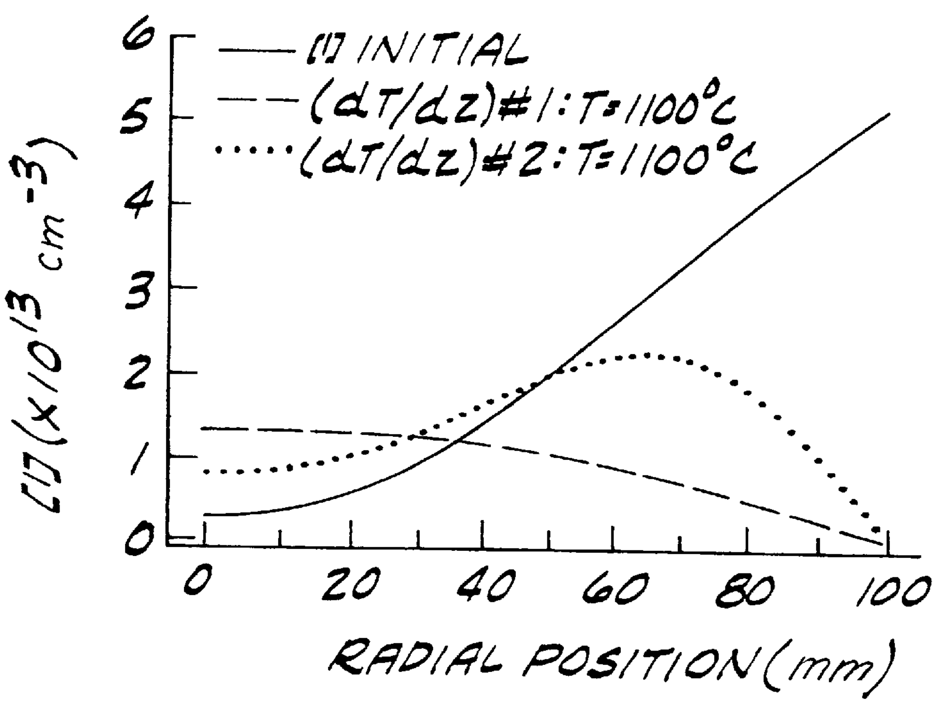
FIG. 20 is a graph of the self-interstitial concentrations resulting from the two cooling conditions illustrated in FIG. 19 and as more fully described in Example 3.
Figure 21:
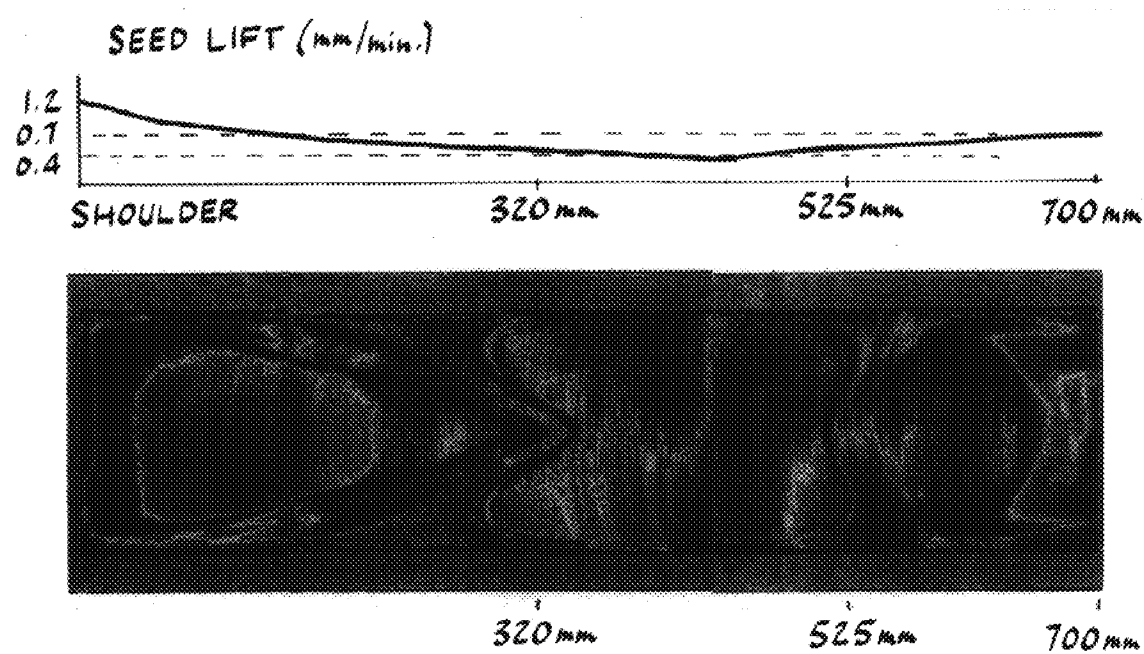
FIG. 21 is an image produced by a scan of the minority carrier lifetime of an axial cut of an entire ingot following a series of oxygen precipitation heat treatments, as described in Example 4.

FIGS. 19 and 20 illustrate the improvement in quality that can be achieved by increasing the time for out-diffusion of interstitials. The concentration of interstitials is calculated for two cases with differing axial temperature profiles in the crystal, dT/dz. The axial temperature gradient at the melt/solid interface is the same for both cases, so that the initial concentration (about 1 cm from the melt/solid interface) of interstitials is the same for both cases. In this example, the pull rate was adjusted such that the entire crystal is interstitial-rich. The pull rate was the same for both cases, 0.32 mm/min. The longer time for interstitial out-diffusion in case 2 results in an overall reduction of the interstitial concentration. This leads to an improvement in the quality of the material since it becomes easier to avoid the formation of interstitial defect clusters due to supersaturation of interstitials.

Example 4

A 700 mm long, 150 mm diameter crystal was grown with a varying pull rate. The pull rate varied nearly linearly from about 1.2 mm/min at the shoulder to about 0.4 mm/min at 430 mm from the shoulder, and then nearly linearly back to about 0.65 mm/min at 700 mm from the shoulder. Under these conditions in this particular crystal puller, the entire radius is grown under interstitial-rich conditions over the length of crystal ranging from about 320 mm to about 525 mm from the shoulder of the crystal. Referring now to FIG.

21, at an axial position of about 525 mm and a pull rate of about 0.47 mm/min, the crystal is free of agglomerated intrinsic point defects clusters across the entire diameter. Stated another way, there is one small section of the crystal in which the width of the axially symmetric region, i.e., the region which is substantially free of agglomerated defects, is equal to the radius of the ingot.

Example 5

As described in Example 1, a series of single crystal silicon ingots were grown at varying pull rates and then analyzed to determine the axial position (and corresponding pull rate) at which agglomerated interstitial defects first appeared or disappeared. Interpolation between and extrapolation from these points, plotted on a graph of pull rate v. axial position, yielded a curve which represents, to a first approximation, the pull rate for a 200 mm crystal as a function of length in the crystal puller at which the axially symmetric region is at its maximum width. Additional crystals were then grown at other pull rates and further analysis of these crystals was used to refine this empirically determined optimum pull rate profile.

Using this data and following this optimum pull rate profile, a crystal of about 1000 mm in length and about 200 mm in diameter was grown. Slices of the grown crystal, obtained from various axial position, were then analyzed using oxygen precipitation methods standard in the art in order to (i) determine if agglomerated interstitial defects were formed, and (ii) determine, as a function of the radius of the slice, the position of the V/I boundary. In this way the presence of an axially symmetric region was determined, as well as the width of this region a function of crystal length or position.

Figure 22:
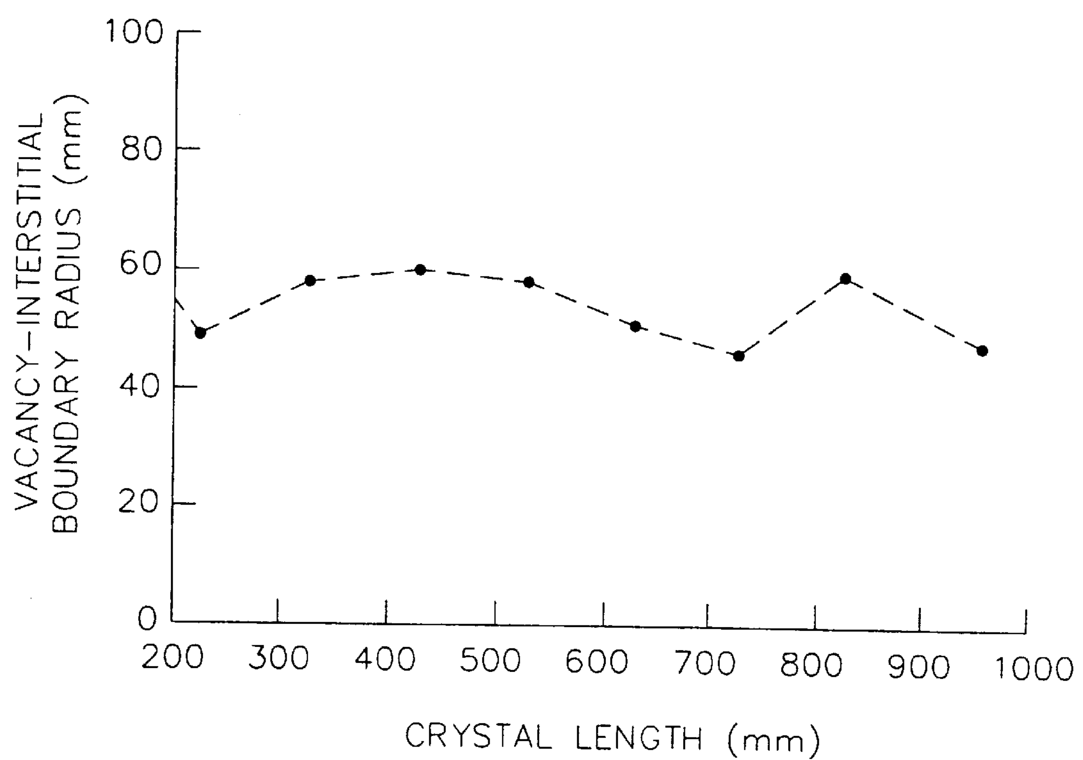
FIG. 22 is a graph illustrating the position of the V/I boundary as a function of the length of the single crystal silicon ingot, as described in Example 5.

The results obtained for axial positions ranging from about 200 mm to about 950 mm from the shoulder of the ingot are present in the graph of FIG. 22. These results show that a pull rate profile may be determined for the growth of a single crystal silicon ingot such that the constant diameter portion of the ingot may contain an axially symmetric region having a width, as measured from the circumferential edge radially toward the central axis of the ingot, which is at least about 40% the length of the radius of the constant diameter portion. In addition, these results show that this axially symmetric region may have a length, as measured along the central axis of the ingot, which is about 75% of the length of the constant diameter portion of the ingot.

Example 6

A single crystal silicon ingot have a length of about 1100 mm and a diameter of about 150 mm was grown with a decreasing pull rate. The pull rate at the shoulder of the constant diameter portion of the ingot was about 1 mm/min. The pull rate decreased exponentially to about 0.4 mm/min., which corresponded to an axial position of about 200 mm from the shoulder. The pull rate then decreased linearly until a rate of about 0.3 mm/min. was reached near the end of the constant diameter portion of the ingot.

Figure 23A:
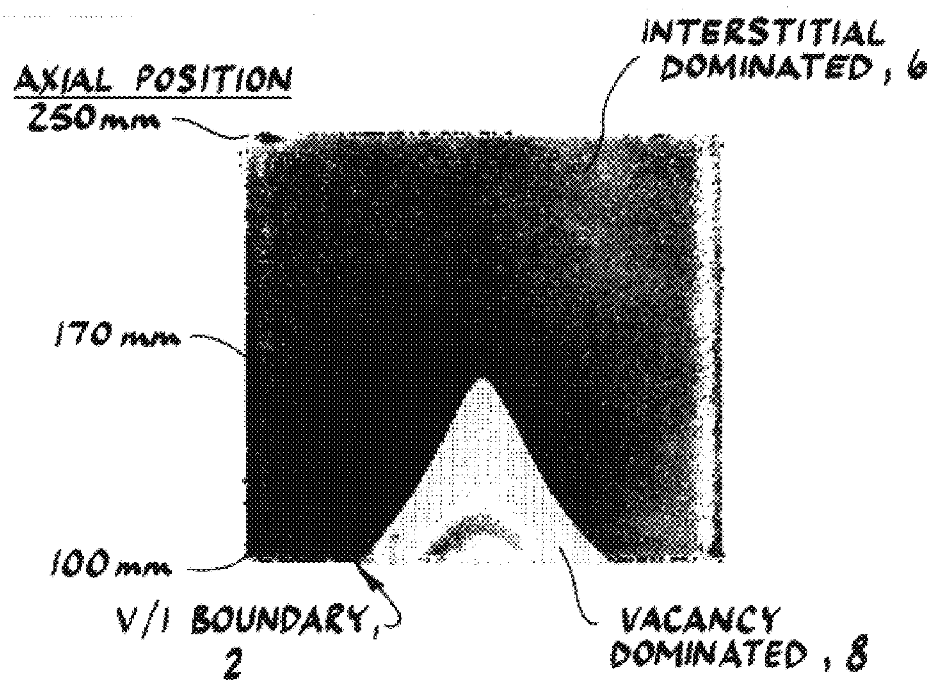
FIG. 23*a* is an image produced by a scan of the minority carrier lifetime of an axial cut of a segment of an ingot, ranging from about 100 mm to about 250 mm from the shoulder of the ingot, following a series of oxygen precipitation heat treatments, as described in Example 6.
Figure 23B:
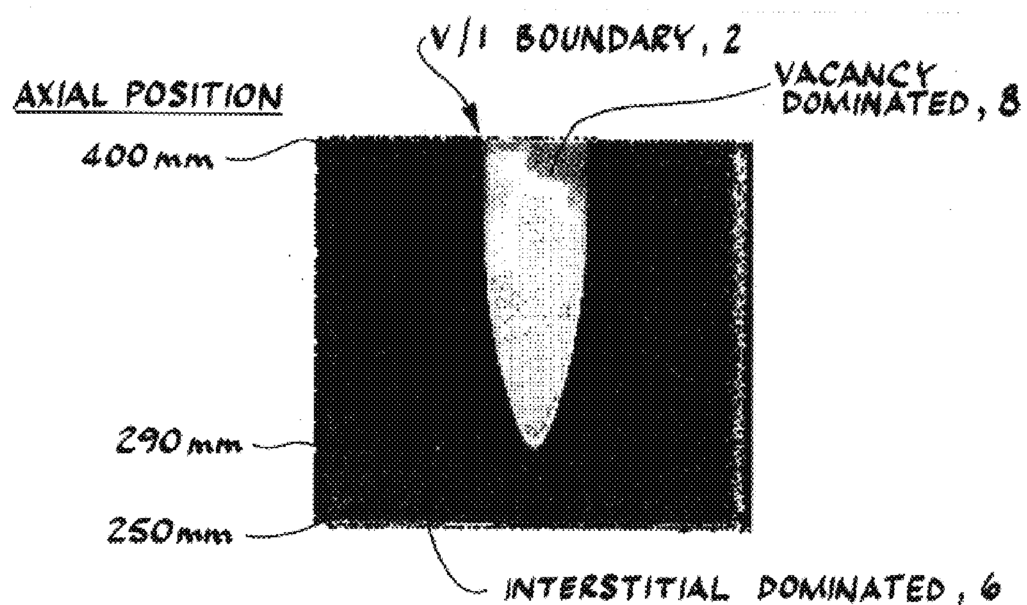
FIG. 23*b* is an image produced by a scan of the minority carrier lifetime of an axial cut of a segment of an ingot, ranging from about 250 mm to about 400 mm from the shoulder of the ingot, following a series of oxygen precipitation heat treatments, as described in Example 6.

Under these process conditions in this particular hot zone configuration, the resulting ingot contains a region wherein the axially symmetric region has a width which about equal to the radius of the ingot. Referring now to FIGS. 23*a* and 23*b*, which are images produced by a scan of the minority carrier lifetime of an axial cut of a portion of the ingot following a series of oxygen precipitation heat treatments, consecutive segments of the ingot, ranging in axial position from about 100 mm to about 250 mm and about 250 mm to about 400 mm are present. It can be seen from these figures that a region exists within the ingot, ranging in axial position from about 170 mm to about 290 mm from the shoulder, which is free of agglomerated intrinsic point defects across the entire diameter. Stated another way, a region is present within the ingot wherein the width of the axially symmetric region, i.e., the region which is substantially free of agglomerated interstitial defects, is about equal to the radius of the ingot.

In addition, in a region ranging from an axially position from about 125 mm to about 170 mm and from about 290 mm to greater than 400 mm there are axially symmetric regions of interstitial dominated material free of agglomerated intrinsic point defects surrounding a generally cylindrical core of vacancy dominated material which is also free of agglomerated intrinsic point defects.

Finally, in a region ranging from an axially position from about 100 mm to about 125 mm there is an axially symmetric region of interstitial dominated material free of agglomerated defects surrounding a generally cylindrical core of vacancy dominated material. Within the vacancy dominated material, there is an axially symmetric region which is free of agglomerated defects surrounding a core containing agglomerated vacancy defects.

Example 7

Cooling Rate and Position of V/I Boundary

A series of single crystal silicon ingots (150 mm and 200 mm nominal diameter), were grown in accordance with the Czochralski method using different hot zone configurations, designed by means common in the art, which affected the residence time of the silicon at temperatures in excess of about 1050° C. The pull rate profile for each ingot was varied along the length of the ingot in an attempt to create a transition from a region of agglomerated vacancy point defects to a region of agglomerated interstitial point defects.

Once grown, the ingots were cut longitudinally along the central axis running parallel to the direction of growth, and then further divided into sections which were each about 2 mm in thickness. Using the copper decoration technique previously described, one set of such longitudinal sections was then heated and intentionally contaminated with copper, the heating conditions being appropriate for the dissolution of a high concentration of copper interstitials. Following this heat treatment, the samples were then rapidly cooled, during which time the copper impurities either outdiffused or precipitated at sites where oxide clusters or agglomerated interstitial defects where present. After a standard defect delineating etch, the samples were visually inspected for the presence of precipitated impurities; those regions which were free of such precipitated impurities corresponded to regions which were free of agglomerated interstitial defects.

Another set of the longitudinal sections was subjected to a series of oxygen precipitation heat treatments in order to cause the nucleation and growth of new oxide clusters prior to carrier lifetime mapping. Contrast bands in lifetime mapping were utilized in order to determine and measure the shape of the instantaneous melt/solid interface at various axial positions in each ingot. Information on the shape of the melt/solid interface was then used, as discussed further below, to estimate the absolute value of, and the radial variation in, the average axial temperature gradient, $G_0$. This information was also used, in conjunction with the pull rate, to estimate the radial variation in $v/G_0$.

To more closely examine the effect growth conditions have on the resulting quality of a single crystal silicon ingot, several assumptions were made which, based on experimental evidence available to-date, are believed to be justified. First, in order to simplify the treatment of thermal history in terms of the time taken to cool to a temperature at which the agglomeration of interstitial defects occurs, it was assumed that about 1050° C. is a reasonable approximation for the temperature at which the agglomeration of silicon self-interstitials occurs. This temperature appears to coincide with changes in agglomerated interstitial defect density observed during experiments in which different cooling rates were employed. Although, as noted above, whether agglomeration occurs is also a factor of the concentration of interstitials, it is believed that agglomeration will not occur at temperatures above about 1050° C. because, given the range of interstitial concentrations typical for Czochralski-type growth processes, it is reasonable to assume that the system will not become critically supersaturated with interstitials above this temperature. Stated another way, for concentrations of interstitials which are typical for Czochralski-type growth processes, it is reasonable to assume that the system will not become critically supersaturated, and therefore an agglomeration event will not occur, above a temperature of about 1050° C.

The second assumption that was made to parameterize the effect of growth conditions on the quality of single crystal silicon is that the temperature dependence of silicon self-interstitial diffusivity is negligible. Stated another way, it is assumed that self-interstitials diffuse at the same rate at all temperatures between about 1400° C. and about 1050° C. Understanding that about 1050° C. is considered a reasonable approximation for the temperature of agglomeration, the essential point of this assumption is that the details of the cooling curve from the melting point does not matter. The diffusion distance depends only on the total time spent cooling from the melting point to about 1050° C.

Using the axial temperature profile data for each hot zone design and the actual pull rate profile for a particular ingot, the total cooling time from about 1400° C. to about 1050° C. may be calculated. It should be noted that the rate at which the temperature changes for each of the hot zones was reasonably uniform. This uniformity means that any error in the selection of a temperature of nucleation for agglomerated interstitial defects, i.e. about 1050° C., will arguably lead only to scaled errors in the calculated cooling time.

In order to determine the radial extent of the vacancy dominated region of the ingot ($R_{vacancy}$), or alternatively the width of the axially symmetric region, it was further assumed that the radius of the vacancy dominated core, as determined by the lifetime map, is equivalent to the point at solidification where $v/G_0=v/G_0$ critical. Stated another way, the width of the axially symmetric region was generally assumed to be based on the position of the V/I boundary after cooling to room temperature. This is pointed out because, as mentioned above, as the ingot cools recombination of vacancies and silicon self-interstitials may occur. When recombination does occur, the actual position of the V/I boundary shifts inwardly toward the central axis of the ingot. It is this final position which is being referred to here.

Figure 25:
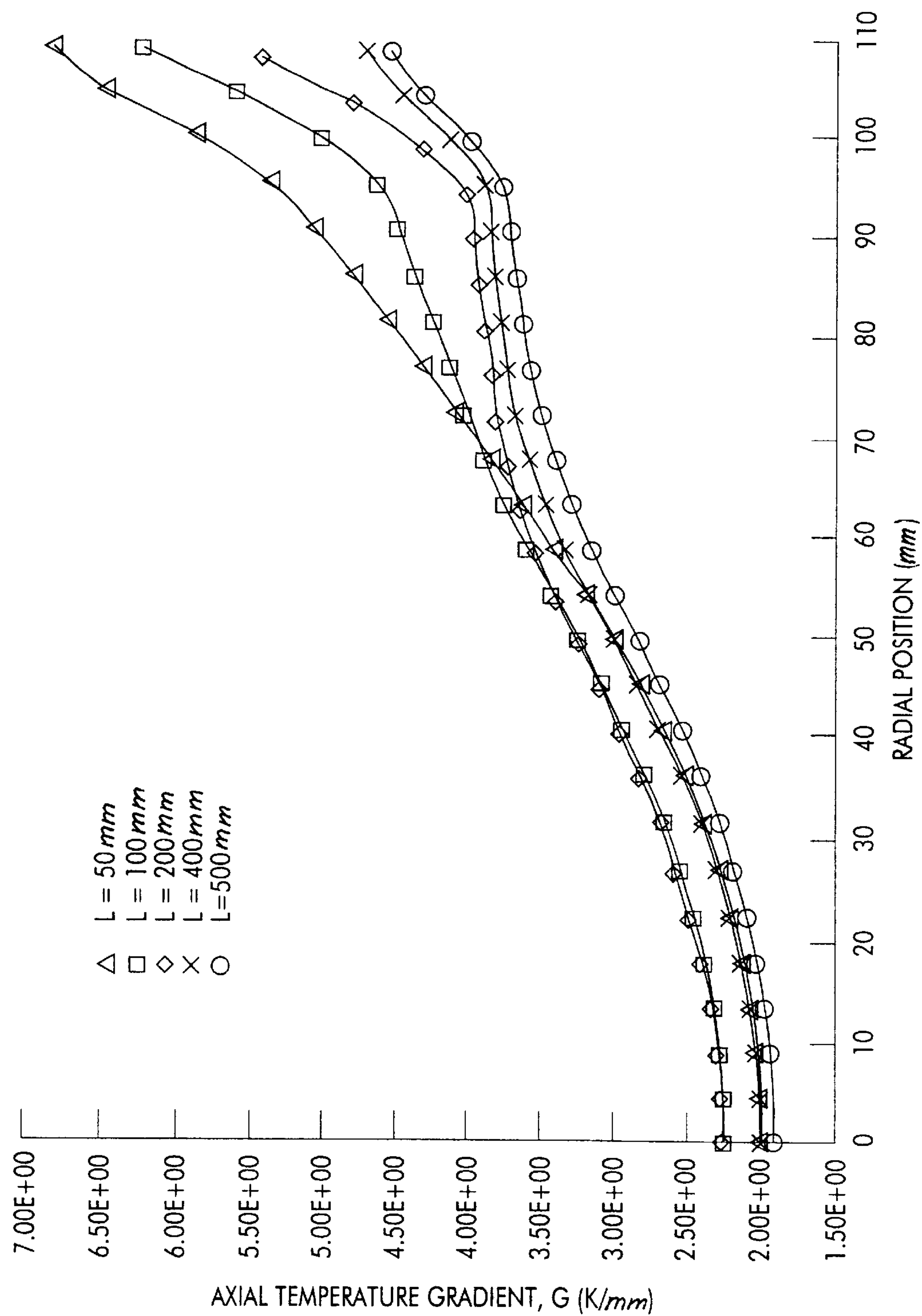
FIG. 25 is a graph of the axial temperature gradient, $G_0$, at various axial positions for an ingot, as described in Example 7.

To simplify the calculation of $G_0$, the average axial temperature gradient in the crystal at the time of solidification, the melt/solid interface shape was assumed to be the melting point isotherm. The crystal surface temperatures were calculated using finite element modeling (FEA) techniques and the details of the hot zone design. The entire temperature field within the crystal, and therefore $G_0$, was deduced by solving Laplace's equation with the proper boundary conditions, namely, the melting point along the melt/solid interface and the FEA results for the surface temperature along the axis of the crystal. The results obtained at various axial positions from one of the ingots prepared and evaluated are presented in FIG. 25.

To estimate the effect that radial variations in $G_0$ have on the initial interstitial concentration, a radial position R', that is, a position halfway between the V/I boundary and the crystal surface, was assumed to be the furthest point a silicon self-interstitial can be from a sink in the ingot, whether that sink be in the vacancy dominated region or on the crystal surface. By using the growth rate and the $G_0$ data for the above ingot, the difference between the calculated $v/G_0$ at the position R' and $v/G_0$ at the V/I boundary (i.e., the critical $v/G_0$ value) provides an indication of the radial variation in the initial interstitial concentration, as well as the effect this has on the ability for excess interstitials to reach a sink on the crystal surface or in the vacancy dominated region.

Figure 26:
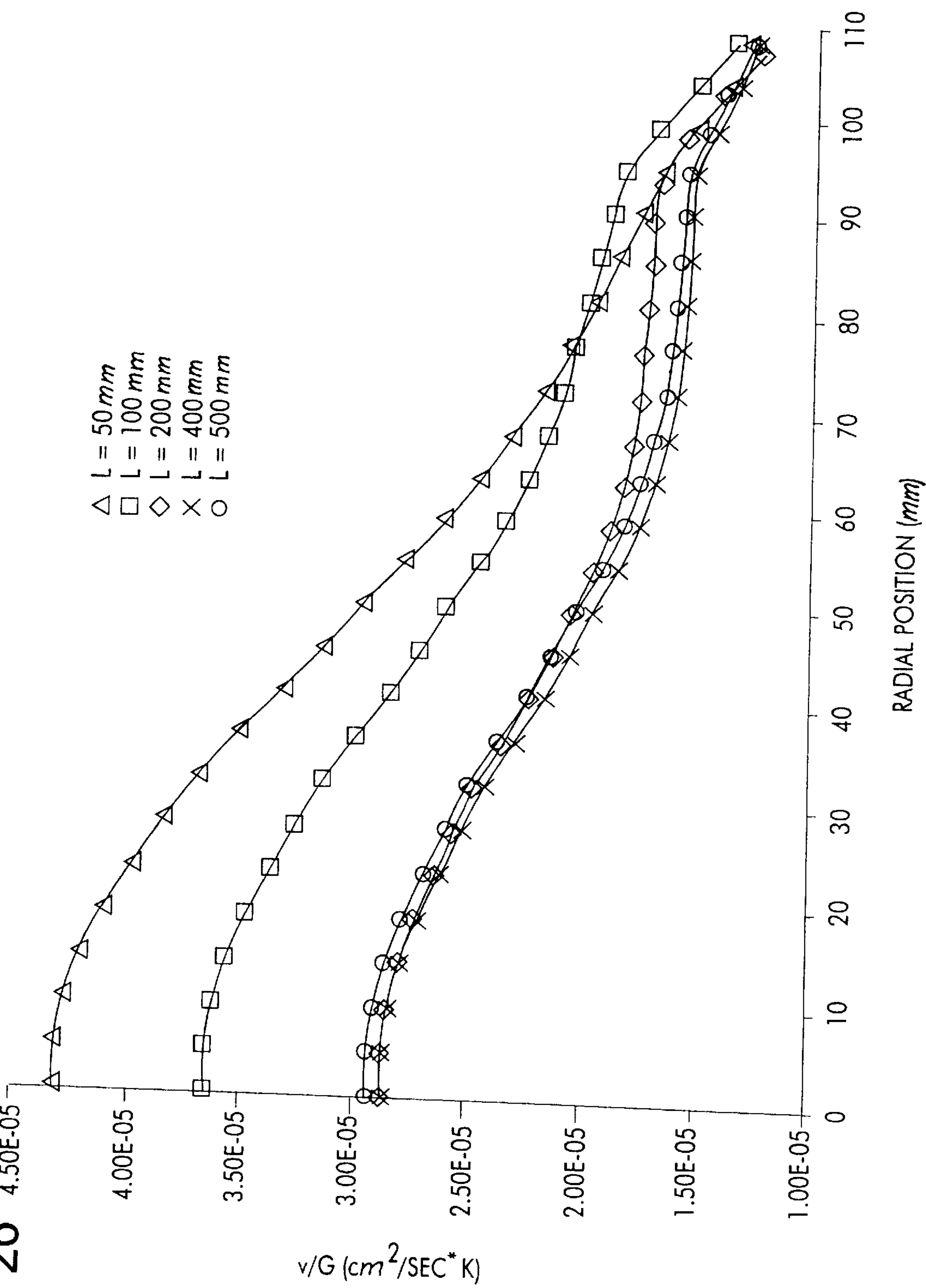
FIG. 26 is a graph of the radial variations in the average axial temperature gradient, $G_0$, at various for an ingot, as described in Example 7.

For this particular data set, it appears there is no systematic dependence of the quality of the crystal on the radial variation in $v/G_0$. As can be seen in FIG. 26, the axial dependence in the ingot is minimal in this sample. The growth conditions involved in this series of experiments represent a fairly narrow range in the radial variation of $G_0$. As a result, this data set is too narrow to resolve a discernable dependence of the quality (i.e., the presence of absence of a band of agglomerated intrinsic point defects) on the radial variation of $G_0$.

Figure 27:
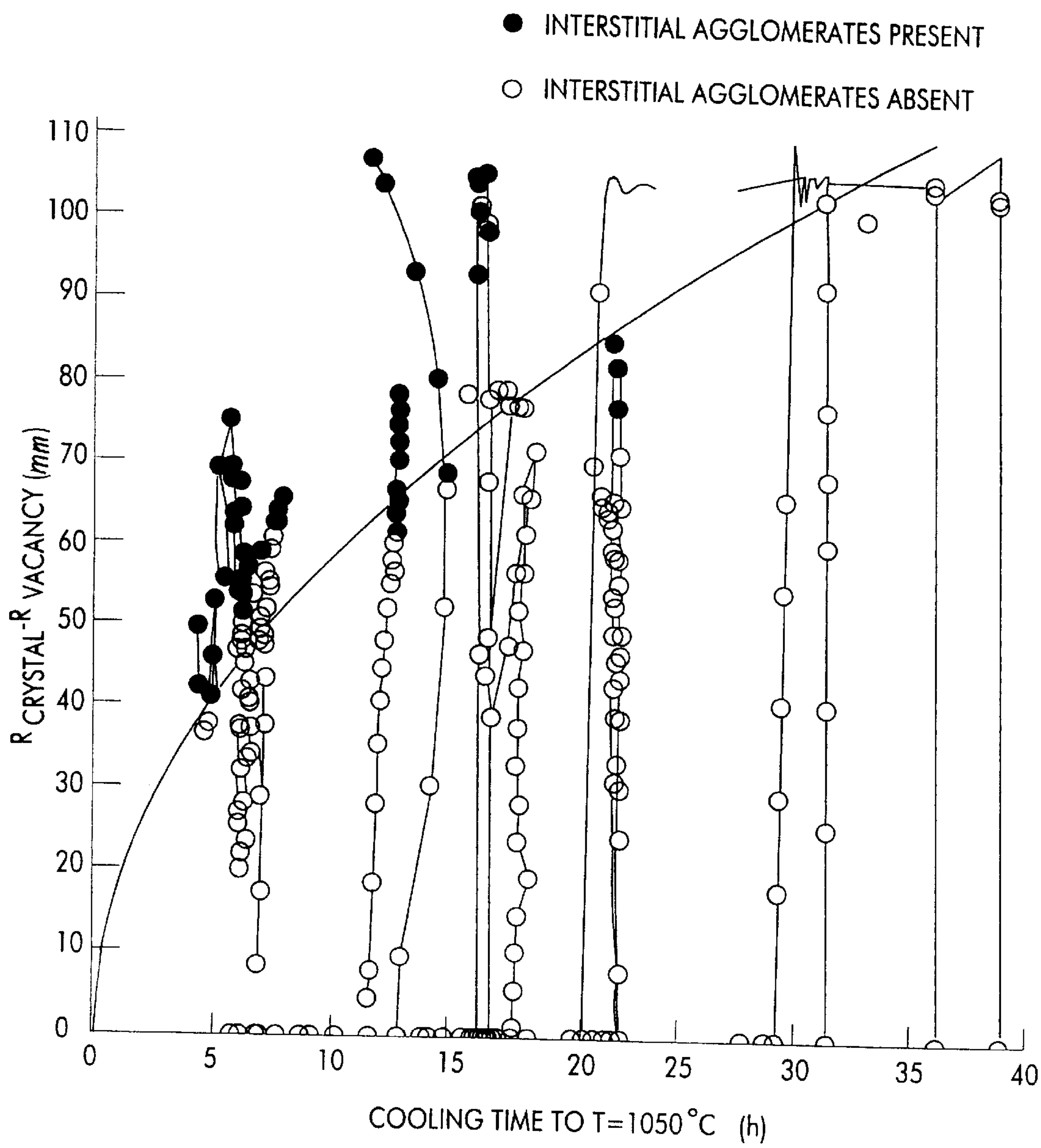
FIG. 27 is a graph illustrating the relationship between the width of the axially symmetric region and the cooling rate, as described in Example 7.

As noted, samples of each ingot prepared were evaluated at various axial positions for the present or absence of agglomerated interstitial defects. For each axial position examined, a correlation may be made between the quality of the sample and the width of the axially symmetric region. Referring now to FIG. 27, a graph may be prepared which compares the quality of the given sample to the time the sample, at that particular axial position, was allowed to cool from solidification to about 1050° C. As expected, this graph shows the width of the axially symmetric region (i.e., $R_{crystal}-R_{vacancy}$) has a strong dependence on the cooling history of the sample within this particular temperature range. In order of the width of the axially symmetric region to increase, the trend suggests that longer diffusion times, or slower cooling rates, are needed.

Based on the data present in this graph, a best fit line may be calculated which generally represents a transition in the quality of the silicon from "good" (i.e., defect-free) to "bad" (i.e., containing defects), as a function of the cooling time allowed for a given ingot diameter within this particular temperature range. This general relationship between the width of the axially symmetric region and the cooling rate may be expressed in terms of the following equation:

$$(R_{crystal}-R_{transition})^2=D_{eff}*t_{1050^\circ C.}$$

wherein $R_{crystal}$ is the radius of the ingot, $R_{transition}$ is the radius of the axially symmetric region at an axial position in the sample were a transition occurs in the interstitial dominated material from being defect-free to containing defects, or vice versa, $D_{eff}$ is a constant, about $9.3*10^{-4}$ $cm^2sec^{-1}$, which represents the average time and temperature of interstitial diffusivity, and $t_{1050^\circ C.}$ is the time required for the given axial position of the sample to cool from solidification to about 1050° C.

Referring again to FIG. 27, it can be seen that, for a given ingot diameter, a cooling time may be estimated in order to obtain an axially symmetric region of a desired diameter. For example, for an ingot having a diameter of about 150 mm, an axially symmetric region having a width about equal to the radius of the ingot may be obtained if, between the temperature range of about 1410° C. and about 1050° C., this particular portion of the ingot is allowed to cool for about 10 to about 15 hours. Similarly, for an ingot having a diameter of about 200 mm, an axially symmetric region having a width about equal to the radius of the ingot may be obtained if between this temperature range this particular portion of the ingot is allowed to cool for about 25 to about 35 hours. If this line is further extrapolated, cooling times of about 65 to about 75 hours may be needed in order to obtain an axially symmetric region having a width about equal to the radius of an ingot having a diameter of about 300 mm. It is to be noted in this regard that, as the diameter of the ingot increases, additional cooling time is required due to the increase in distance that interstitials must diffuse in order to reach sinks at the ingot surface or the vacancy core.

Referring now to FIGS. 28, 29, 30 and 31, the effects of increased cooling time for various ingots may be observed. Each of these figures depicts a portion of a ingot having a nominal diameter of 200 mm, with the cooling time from the temperature of solidification to 1050° C. progressively increasing from FIG. 28 to FIG. 31.

Figure 28:
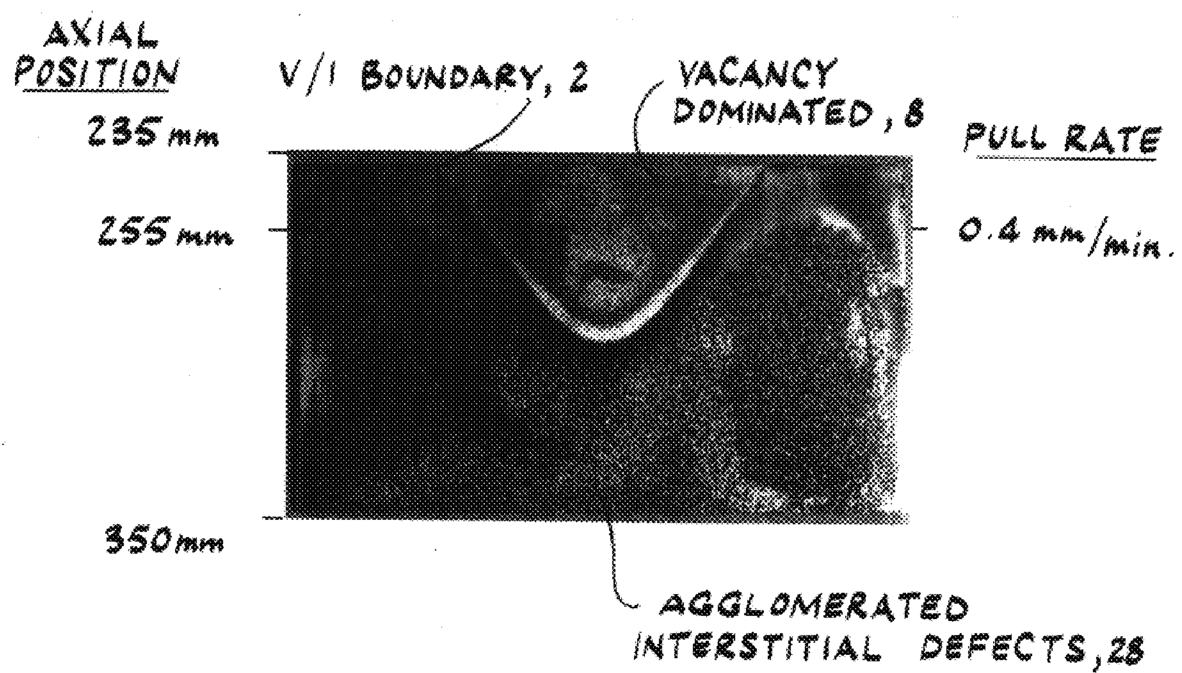
FIG. 28 is a photograph of an axial cut of a segment of an ingot, ranging from about 235 mm to about 350 mm from the shoulder of the ingot, following copper decoration and a defect-delineating etch, described in Example 7.

Referring to FIG. 28, a portion of an ingot, ranging in axial position from about 235 mm to about 350 mm from the shoulder, is shown. At an axial position of about 255 mm, the width of the axially symmetric region free of agglomerated interstitial defects is at a maximum, which is about 45% of the radius of the ingot. Beyond this position, a transition occurs from a region which is free of such defects, to a region in which such defects are present.

Figure 29:
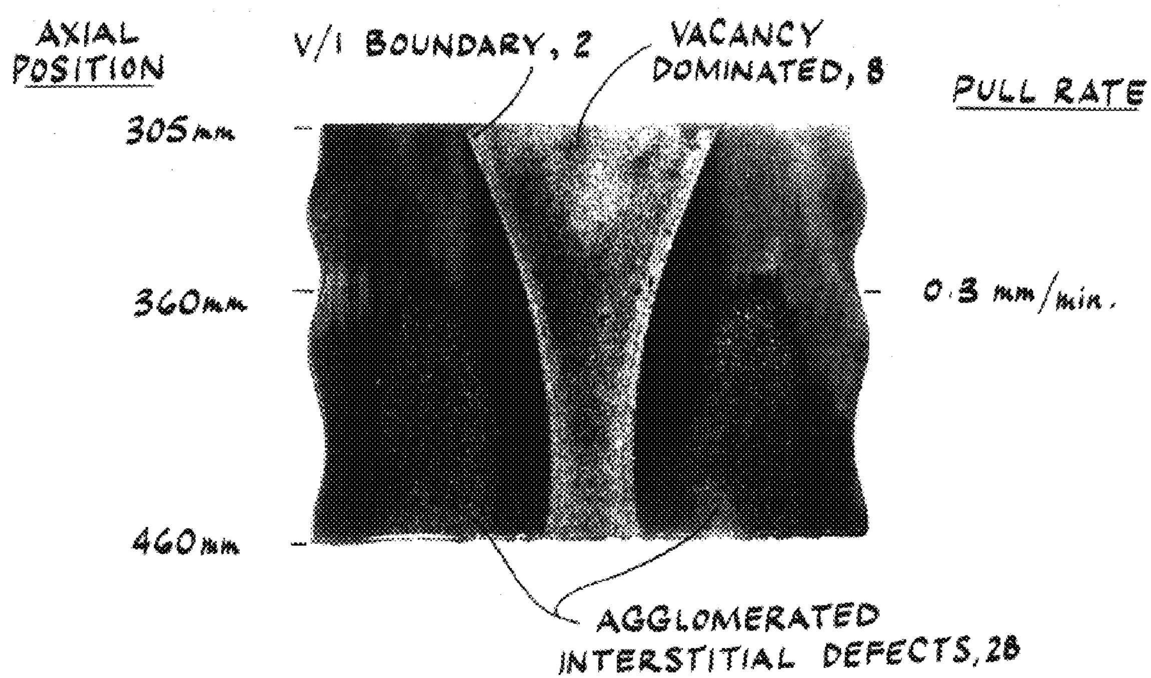
FIG. 29 is a photograph of an axial cut of a segment of an ingot, ranging from about 305 mm to about 460 mm from the shoulder of the ingot, following copper decoration and a defect-delineating etch, described in Example 7.

Referring now to FIG. 29, a portion of an ingot, ranging in axial position from about 305 mm to about 460 mm from the shoulder, is shown. At an axial position of about 360 mm, the width of the axially symmetric region free of agglomerated interstitial defects is at a maximum, which is about 65% of the radius of the ingot. Beyond this position, defect formation begins.

Figure 30:
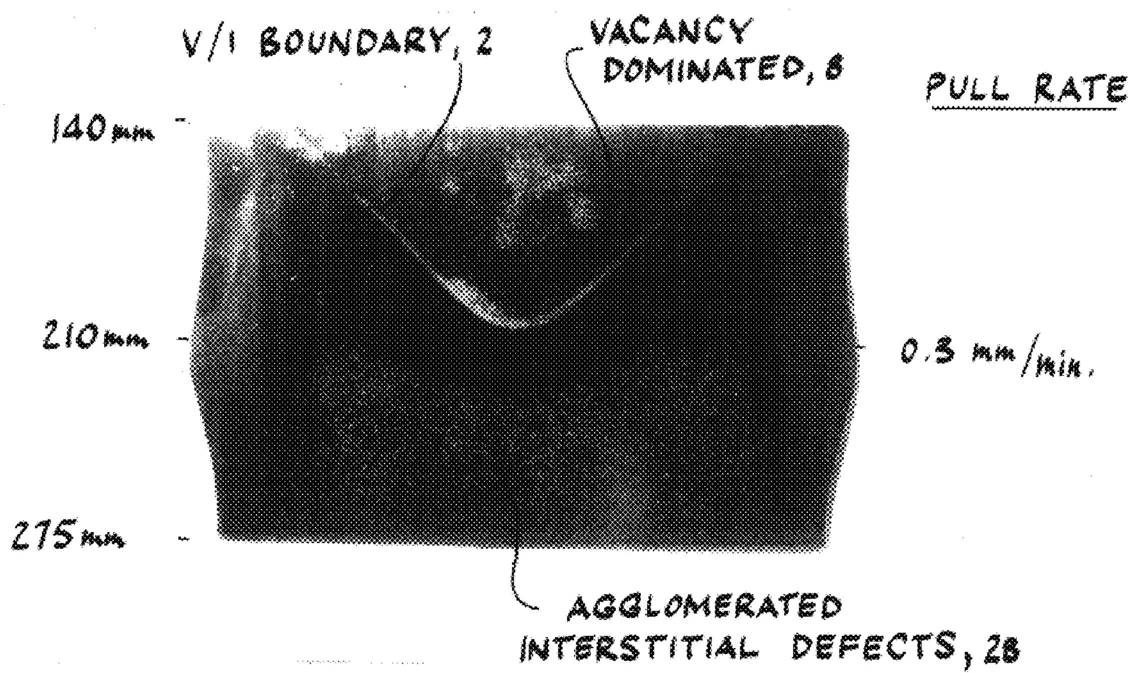
FIG. 30 is a photograph of an axial cut of a segment of an ingot, ranging from about 140 mm to about 275 mm from the shoulder of the ingot, following copper decoration and a defect-delineating etch, described in Example 7.

Referring now to FIG. 30, a portion of an ingot, ranging in axial position from about 140 mm to about 275 mm from the shoulder, is shown. At an axial position of about 210 mm, the width of the axially symmetric region is about equal to the radius of the ingot; that is, a small portion of the ingot within this range is free of agglomerated intrinsic point defects.

Figure 31:
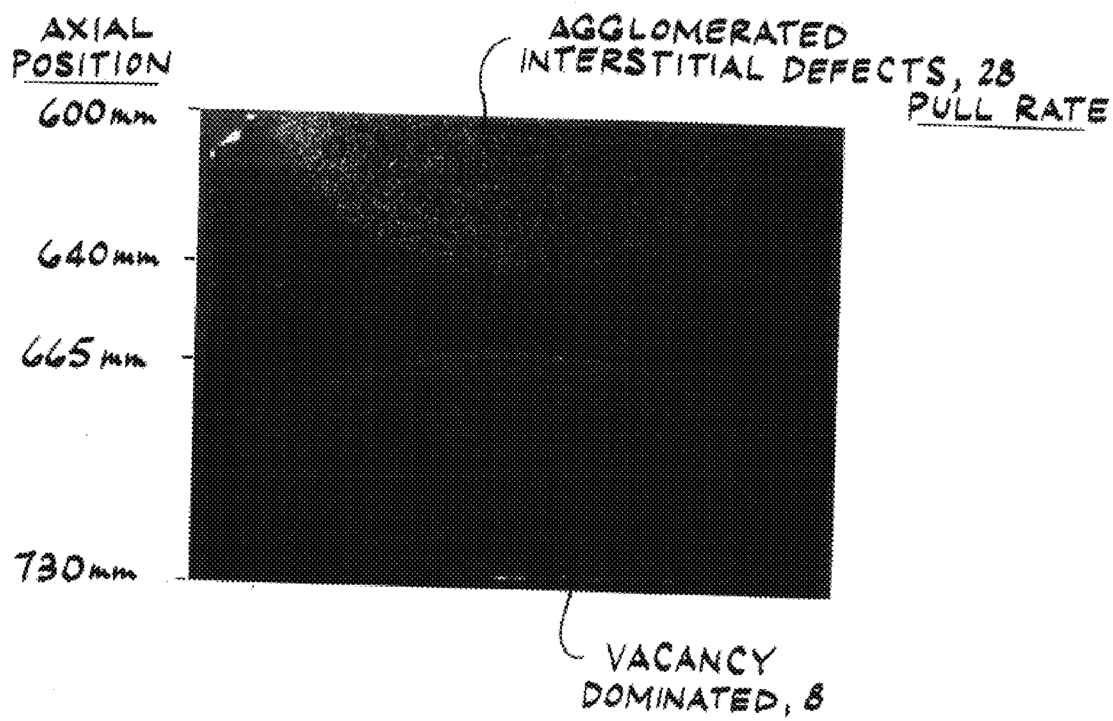
FIG. 31 is a photograph of an axial cut of a segment of an ingot, ranging from about 600 mm to about 730 mm from the shoulder of the ingot, following copper decoration and a defect-delineating etch, described in Example 7.

Referring now to FIG. 31, a portion of an ingot, ranging in axial position from about 600 mm to about 730 mm from the shoulder, is shown. Over an axial position ranging from about 640 mm to about 665 mm, the width of the axially symmetric region is about equal to the radius of the ingot. In addition, the length of the ingot segment in which the width of the axially symmetric region is about equal to the radius of the ingot is greater than what is observed in connection with the ingot of FIG. 30.

When viewed in combination, therefore, FIGS. 28, 29, 30, and 31 demonstrate the effect of cooling time to 1050° C. upon the width and the length of the defect-free, axially symmetric region. In general, the regions containing agglomerated interstitial defects occurred as a result of a continued decrease of the crystal pull rate leading to an initial interstitial concentration which was too large to reduce for the cooling time of that portion of the crystal. A greater length of the axially symmetric region means a larger range of pull rates (i.e., initial interstitial concentration) are available for the growth of such defect-free material. Increasing the cooling time allows for initially higher concentration of interstitials, as sufficient time for radial diffusion may be achieved to suppress the concentration below the critical concentration required for agglomeration of interstitial defects. Stated in other words, for longer cooling times, somewhat lower pull rates (and, therefore, higher initial interstitial concentrations) will still lead to maximum axially symmetric region 6. Therefore, longer cooling times lead to an increase in the allowable pull rate variation about the condition required for maximum axially symmetric region diameter and ease the restrictions on process control. As a result, the process for an axially symmetric region over large lengths of the ingot becomes easier.

Referring again to FIG. 31, over an axial position ranging from about 665 mm to greater than 730 mm from the shoulder of crystal, a region of vacancy dominated material free of agglomerated defects is present in which the width of the region is equal to the radius of the ingot.

As can be seen from the above data, by means of controlling the cooling rate, the concentration of self-interstitials may be suppressed by allowing more time for interstitials to diffuse to regions where they may be annihilated. As a result, the formation of agglomerated interstitial defects is prevented within significant portion of the single crystal silicon ingot.

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

What is claimed is:

1. A process for growing a single crystal silicon ingot in which the ingot comprises a central axis, a seed-cone, an end-cone and a constant diameter portion between the seed-cone and the end-cone having a circumferential edge, a radius extending from the central axis to the circumferential edge, and a nominal diameter of 150 mm, 200 mm, or greater than 200 mm, the ingot being grown from a silicon melt and then cooled from the solidification temperature in accordance with the Czochralski method, the process comprising controlling (i) a growth velocity, v, (ii) an average axial temperature gradient, $G_0$, during the growth of the constant diameter portion of the crystal over the temperature range from solidification to a temperature of no less than about 1325° C., and (iii) the cooling rate of the crystal from the solidification temperature to about 1,050° C. to cause the formation of an axially symmetrical segment which is substantially free of agglomerated intrinsic point defects wherein the axially symmetric region extends inwardly from the circumferential edge of the ingot, has a width as measured from the circumferential edge radially toward the central axis of the ingot which is at least about three-tenths the length of the radius of the ingot, and has a length as measured along the central axis of at least about two-tenths the length of the constant diameter portion of the ingot.

2. The process of claim 1 wherein the crystal has a nominal diameter of about 150 mm and is cooled from the solidification temperature to a temperature of at least about 1,050° C. over a period of at least about 10 hours.

3. The process of claim 1 wherein the crystal has a nominal diameter of about 150 mm and is cooled from the solidification temperature to a temperature of at least about 1,050° C. over a period of at least about 15 hours.

4. The process of claim 1 wherein the crystal has a nominal diameter of about 200 mm and is cooled from the solidification temperature to a temperature of at least about 1,050° C. over a period of at least about 10 hours.

5. The process of claim 1 wherein the crystal has a nominal diameter of about 200 mm and is cooled from the solidification temperature to a temperature of at least about 1,050° C. over a period of at least about 20 hours.

6. The process of claim 1 wherein the crystal has a nominal diameter of greater than 200 mm and is cooled from the solidification temperature to a temperature of at least about 1,050° C. over a period of at least about 40 hours.

7. The process of claim 1 wherein the crystal has a nominal diameter of greater than 200 mm and is cooled from the solidification temperature to a temperature of at least about 1,050° C. over a period of at least about 60 hours.

8. The process of claim 1 wherein the length of the axially symmetric region is at least about three-tenths the length of the constant diameter portion of the ingot.

9. The process of claim 8 wherein the crystal has a nominal diameter of about 150 mm and is cooled from the solidification temperature to a temperature of at least about 1,050° C. over a period of at least about 10 hours.

10. The process of claim 8 wherein the crystal has a nominal diameter of about 150 mm and is cooled from the solidification temperature to a temperature of at least about 1,050° C. over a period of at least about 15 hours.

11. The process of claim 8 wherein the crystal has a nominal diameter of about 200 mm and is cooled from the solidification temperature to a temperature of at least about 1,050° C. over a period of at least about 10 hours.

12. The process of claim 8 wherein the crystal has a nominal diameter of about 200 mm and is cooled from the solidification temperature to a temperature of at least about 1,050° C. over a period of at least about 20 hours.

13. The process of claim 8 wherein the crystal has a nominal diameter of greater than 200 mm and is cooled from the solidification temperature to a temperature of at least about 1,050° C. over a period of at least about 40 hours.

14. The process of claim 8 wherein the crystal has a nominal diameter of greater than 200 mm and is cooled from the solidification temperature to a temperature of at least about 1,050° C. over a period of at least about 60 hours.

15. The process of claim 1 wherein the growth velocity, v, and the average axial temperature gradient, $G_0$, are controlled such that the ratio, $v/G_0$, ranges in value from about 0.6 to about 1.5 times the critical value of $v/G_0$.

16. The process of claim 1 wherein the growth velocity, v, and the average axial temperature gradient, $G_0$, are controlled such that the ratio $v/G_0$ ranges in value from about 0.75 to about 1 times the critical value of $v/G_0$.

17. The process of claim 1 wherein the average axial temperature gradient, $G_0$, is controlled over the temperature range from solidification to a temperature of no less than about 1350° C.

18. The process of claim 17 the crystal has a nominal diameter of about 150 mm and is cooled from the solidification temperature to a temperature of at least about 1,050° C. over a period of at least about 15 hours.

19. The process of claim 17 the crystal has a nominal diameter of about 200 mm and is cooled from the solidification temperature to a temperature of at least about 1,050° C. over a period of at least about 15 hours.

20. The process of claim 17 the crystal has a nominal diameter of greater than 200 mm and is cooled from the solidification temperature to a temperature of at least about 1,050° C. over a period of at least about 40 hours.

* * * * *

UNITED STATES PATENT AND TRADEMARK OFFICE

CERTIFICATE OF CORRECTION

PATENT NO. : 6,254,672 B1
DATED : July 3, 2001
INVENTOR(S) : Robert J. Falster et al.

It is certified that error appears in the above-identified patent and that said Letters Patent is hereby corrected as shown below:

Title page,
Item [75], Inventors, "Robert A. Falster" should read -- Robert J. Falster --.

Column 26,
Line 22, "claim 17 the crystal" should read -- claim 17 wherein the crystal --.
Line 26, "claim 17 the crystal" should read -- claim 17 wherein the crystal --.
Line 30, "claim 17 the crystal" should read -- claim 17 wherein the crystal --.

Signed and Sealed this

Twentieth Day of August, 2002

*Attest:*

JAMES E. ROGAN

*Attesting Officer* *Director of the United States Patent and Trademark Office*